(12) United States Patent
Hsieh

(10) Patent No.: US 8,643,092 B2
(45) Date of Patent: *Feb. 4, 2014

(54) SHIELDED TRENCH MOSFET WITH MULTIPLE TRENCHED FLOATING GATES AS TERMINATION

(75) Inventor: Fu-Yuan Hsieh, New Taipei (TW)

(73) Assignee: Force Mos Technology Co., Ltd., New Taipei (TW)

(*) Notice: Subject to any disclaimer, the term of this patent is extended or adjusted under 35 U.S.C. 154(b) by 140 days.

This patent is subject to a terminal disclaimer.

(21) Appl. No.: 13/169,323

(22) Filed: Jun. 27, 2011

(65) Prior Publication Data

US 2011/0254086 A1 Oct. 20, 2011

Related U.S. Application Data

(63) Continuation-in-part of application No. 12/591,467, filed on Nov. 20, 2009, now Pat. No. 7,989,887.

(51) Int. Cl.
*H01L 29/76* (2006.01)
*H01L 29/94* (2006.01)

(52) U.S. Cl.
USPC ........... 257/330; 257/329; 257/331; 257/332; 257/341; 438/259; 438/270; 438/271

(58) Field of Classification Search
USPC ................. 257/329–333, 341, 374, E29.262; 438/259, 270, 271
See application file for complete search history.

(56) References Cited

U.S. PATENT DOCUMENTS 7,989,887 B2 * 8/2011 Hsieh ............................ 257/330
2011/0254071 A1 * 10/2011 Hsieh ............................ 257/315

* cited by examiner

*Primary Examiner* — Theresa T Doan
(74) *Attorney, Agent, or Firm* — Bacon & Thomas, PLLC

(57) ABSTRACT

A trench MOSFET comprising a plurality of transistor cells having shielded trenched gates and multiple trenched floating gates as termination region is disclosed. The trenched floating gates have trench depth equal to or deeper than body junction depth of body regions in termination area. In some preferred embodiments, the trenched floating gates in the termination area are implemented by using shielded electrode structure.

22 Claims, 24 Drawing Sheets

SHIELDED TRENCH MOSFET WITH MULTIPLE TRENCHED FLOATING GATES AS TERMINATION

CROSS REFERENCE TO RELATED APPLICATIONS

This application is a continuation-in-part (CIP) of U.S. application Ser. No. 12/591,467, filed on Nov. 20, 2009.

FIELD OF THE INVENTION

This invention relates generally to the cell structure, device configuration and fabrication process of power semiconductor devices. More particularly, this invention relates to a novel and improved cell structure, device configuration and improved process for fabricating trench metal-oxide-semiconductor-field-effect-transistors (MOSFETs) with trenched floating gates as termination to maintain a high breakdown voltage and to achieve a lower gate-to-drain charge Qgd and lower fabrication cost.

BACKGROUND OF THE INVENTION

Typical structures of trench metal-oxide-semiconductor-field-effect-transistors (MOSFETs) having trenched floating gates as termination in prior arts are encountering technical problems. For example, in U.S. Pat. No. 6,462,376, a trench MOSFET was disclosed with n+ source regions disposed in termination area comprising multiple of trenched floating gates, as shown in FIG. 1A. In the termination area, a plurality of the n+ source regions 120 are disposed between two adjacent of the trenched floating gates 111. This kind of structure will cause heavily leakage current between drain region and the source region because that channel region is turned on in the termination area due to a plurality of P body regions 108 having floating voltage and the trenched floating gates 111 are not shorted together with the n+ source regions 120 at drain/source reversed bias. An electrical current will flow from the drain region through the channel region between two adjacent of the trenched floating gates 111 in the termination area to the n+ source region 120 in active area.

Please refer to FIG. 1B for another prior art U.S. Pat. No. 7,511,339 which disclosed another trench MOSFET structure without having source regions in the termination area but with depth of the trenched floating gates 110 (TFd) shallower than depth of floating deep P body regions 130 (Pd). However, from experimental results of the relationship between breakdown voltage (BV) and difference between TFd and Pd in FIG. 2, it can bee seen that, the breakdown voltage is significantly degraded as the difference (TFd−Pd) is getting smaller when TFd<Pd, thus causing low breakdown voltage in the termination area due to poor isolation between drain region and the source region by the trenched floating gates 110 having shallower depth in the termination area. The floating deep P body regions 130 are electrically connected together by charge depletion of the floating deep P body regions 130 at drain/source reversed bias because the trenched floating gates 110 is shallower than the floating deep P body regions 130. Therefore, an electrically current will directly flow from edge of the termination area to the source region in the active area without being blocked by the trenched floating gates 110 in the termination area.

Meanwhile, compared to a conventional trench MOSFET, a trench MOSFET having shielded trenched gates is more attractive due to its reduced Cgd (capacitance between gate and drain) in accordance with reduced Qgd, and increased breakdown voltage of the trench MOSFET, making an excellent choice for power switching applications such as inverter and DC to DC power supply circuits.

Therefore, there is still a need in the art of the semiconductor device design and fabrication, particularly for trench MOSFET design and fabrication, to provide a novel cell structure, device configuration and fabrication process that would resolve these difficulties and design limitations. Specifically, it is desirable to maintain high breakdown voltage in the termination area of a trench MOSFET.

SUMMARY OF THE INVENTION

The present invention provides trench MOSFET having a plurality of transistor cells in active area and multiple trenched floating gates in termination area, specifically, the trench depth of the trenched floating gates in the termination area is equal to or deeper than junction of body regions surrounding the trenched floating gates without having source regions disposed wherein to maintain high breakdown voltage. Some preferred trench MOSFET transistor cells exhibit low gate-to-drain charge Qgd.

According to one aspect, the invention features a trench MOSFET having a plurality of transistor cells in the active area and multiple trenched floating gates in the termination area, further includes: (a) a substrate of a first conductivity type; (b) an epitaxial layer of the first conductivity type grown on the substrate, the epitaxial layer has a lower doping concentration than the substrate; (c) a plurality of source regions of the first conductivity type formed near top surface of the epitaxial layer only within the active area, the source regions have a doping concentration higher than the epitaxial layer; (d) a plurality of first type body regions of a second conductivity type formed beneath the source regions in the active area; (e) a plurality of second type body regions of the second conductivity type formed in the epitaxial layer from top surface of the epitaxial layer around outside of the active area including the termination area, and the source regions being not disposed on the top of the second type body regions; (f) an insulation layer formed on the epitaxial layer; (g) a plurality of shielded trenched gates in the active area, wherein each the shielded trenched gate comprising a gate electrode disposed in the upper portion and a shielded electrode disposed in the lower portion, wherein the gate electrode and the shielded electrode insulated from each other by an inter-electrode insulation layer, wherein the gate electrode is connected to a gate metal formed over the insulation layer and the shielded electrode is connected to a source metal formed over the insulation layer; (h) multiple trenched floating gates having floating voltage in parallel formed in termination area around outside of the active area, the trenched floating gates are surrounded by the second type body regions and extending into the epitaxial layer, the trenched floating gates have trench depth equal to or deeper than body junction of the second type body regions; (i) each the second type body region between two adjacent trenched floating gates in the termination area has floating voltage; (j) a drain metal on rear side of the substrate.

According to another aspect, in some preferred embodiments, the trenched floating gates in the termination area are each filled with a single electrode onto a gate oxide layer which lined each of the trenched floating gates.

According to another aspect, in some preferred embodiments, the trenched floating gates are implemented by using the same shielded trenched gate structure and conductive materials as the shielded trenched gates in the active area.

According to another aspect, in some preferred embodiment, the trenched floating gates in the termination area have same trench width and depth as the shielded trenched gates in the active area.

According to another aspect, in some preferred embodiment, the trenched floating gates in the termination area have greater trench width than the shielded trenched gates in the active area.

According to another aspect, in some preferred embodiment, the width of the trenched floating gates in the termination area increases or decreases toward edge of the termination area.

According to another aspect, in some preferred embodiment, the trench space between every two adjacent of the trenched floating gates in the termination area is equal or increased toward the edge of the termination area.

Preferred embodiments include one or more of the following features: the shielded trenched gates each comprises a first type gate oxide along sidewalls of the gate electrode and a second type gate oxide surrounding bottom and sidewalls of the shielded electrode, wherein the second type gate oxide has oxide thickness greater than the first type gate oxide; the shielded trenched gates in the active area further extend to at least a wider shielded trenched gate for gate connection, wherein the wider shielded trenched gate has the same shielded gate structure as the shielded trenched gates in the active area while has greater trench width than the shielded trenched gates in the active area; the present invention further comprises a wider trenched gate filled with a single electrode onto a gate oxide layer between the active area and the wider shielded trenched gate for shielded electrode contact; the present invention further comprises a plurality of trenched source-body contacts with each filled with metal plug, penetrating through the insulation layer, the source region and extending into the first type body region, wherein the metal plug is padded by a barrier layer and contacting with the source metal; the present invention further comprises at least a trenched gate contact with each filled with metal plug, penetrating through the insulation layer and extending into the gate electrode in the wider shielded trenched gate, wherein the metal plug is padded by a barrier layer and contacting with the gate metal; the present invention further comprises at least a trenched shielded contact with each filled with metal plug, penetrating through the insulation layer and extending into the single electrode in the wider trenched gate for shielded electrode contact, wherein the metal plug is padded by a barrier layer and contacting with the source metal; there is a body contact region of the second conductivity type underneath each of the trenched source-body contacts and within the first type body region, the body contact region has a higher doping concentration than the first type body region; the source regions in the active area have uniform doping concentration and same junction depth along the top surface of the epitaxial layer; the source regions in the active area have doping concentration of Gaussian-distribution from center of each the first type body region to adjacent channel region and shallower junction depth near the channel region than near the center of the first type P body region The invention also features a method of making a trench MOSFET having a plurality of transistor cells in the active area and multiple of trenched floating gates in the termination area including (a) growing an epitaxial layer with a first conductivity type upon a heavily doped substrate with a first conductivity type; (b) applying a trench mask and forming a plurality of first type gate trenches in the active area, at least a second type gate trench having gate trench wider than said first type gate trench in gate runner metal area, and multiple of third type gate trenches in the termination area; (c) growing a sacrificial oxide layer onto inner surface of all the gate trenches to remove the plasma damage; (d) removing said sacrificial oxide and growing or depositing a first insulation layer along inner surface of said first, second and third type gate trenches as gate oxide; (e) depositing doped poly-silicon with said first conductivity type into said first, second and third type gate trenches and etching back said doped poly-silicon; (f) implanting said epitaxial layer with a second conductivity type dopant and diffusing it to form body regions without having body mask; (g) implanting said epitaxial layer with a first conductivity type dopant through source mask and diffusing it to form source regions; (h) depositing a second insulation layer functioning as thick oxide interlayer on the top surface of said epitaxial layer and said first, second and third type trenched gates; (i) applying a contact mask and dry oxide etching to remove said oxide interlayer from contact open areas; (j) forming trenched source-body contact into body region and trenched gate contact into doped poly-silicon in said second type gate trench by dry silicon and poly-silicon etching through said contact open areas, respectively and simultaneously, and (k) ion implanting said trenched source-body contact with a dopant having said second conductivity type and activating it by RTA to form body contact area with said second conductivity type around bottom of said trenched source-body contact.

Preferred embodiments include one or more of the following features. Said trenched source-body contacts and said trenched gate contacts are filled with Ti/TiN/W or Co/TiN/W metal plugs connecting with a resistance-reduction layer of Ti or Ti/TiN underneath said source metal of Al alloys. Said trenched source-body contacts and said trenched gate contacts are filled with source metal such as Ti/TiN/Al alloys or Co/TiN/Al alloys.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1A:
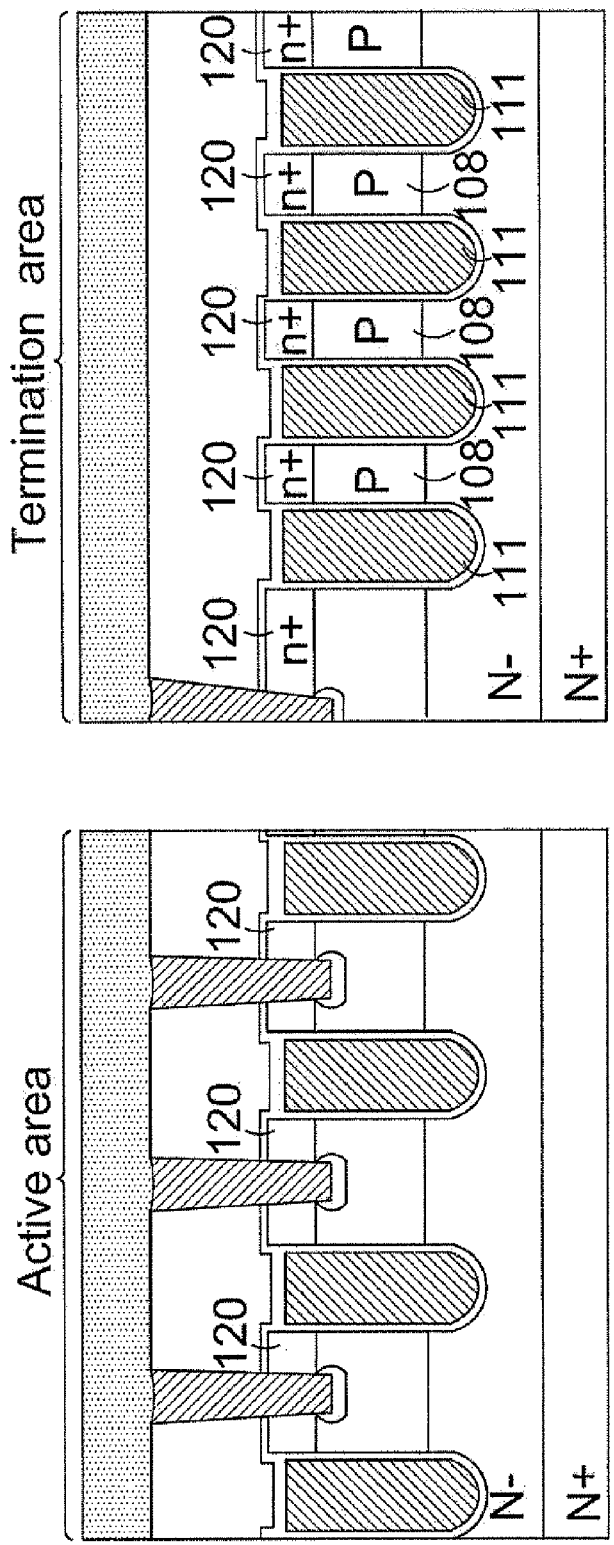
FIG. 1A is a cross-sectional view of a trench MOSFET of prior art.
Figure 1B:
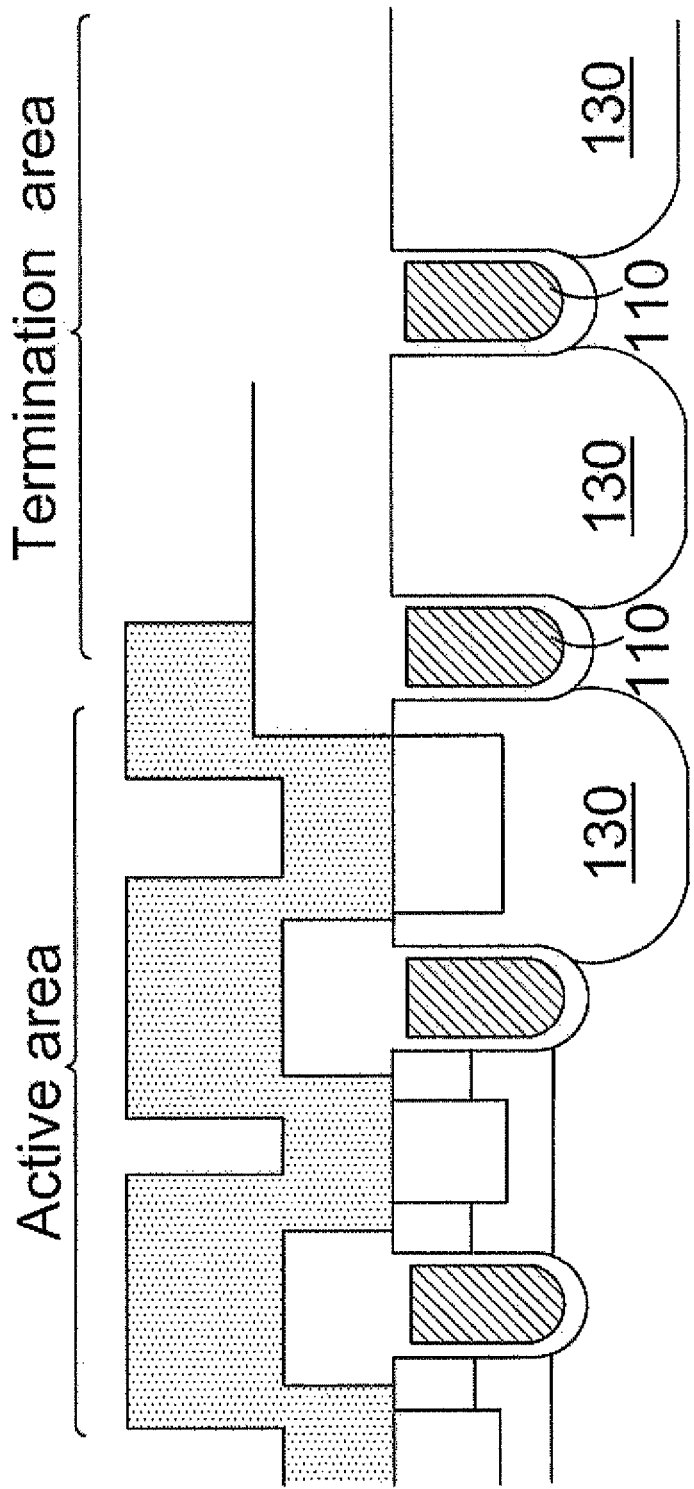
FIG. 1B is a cross-sectional view of a trench MOSFET of another prior art.
Figure 2:
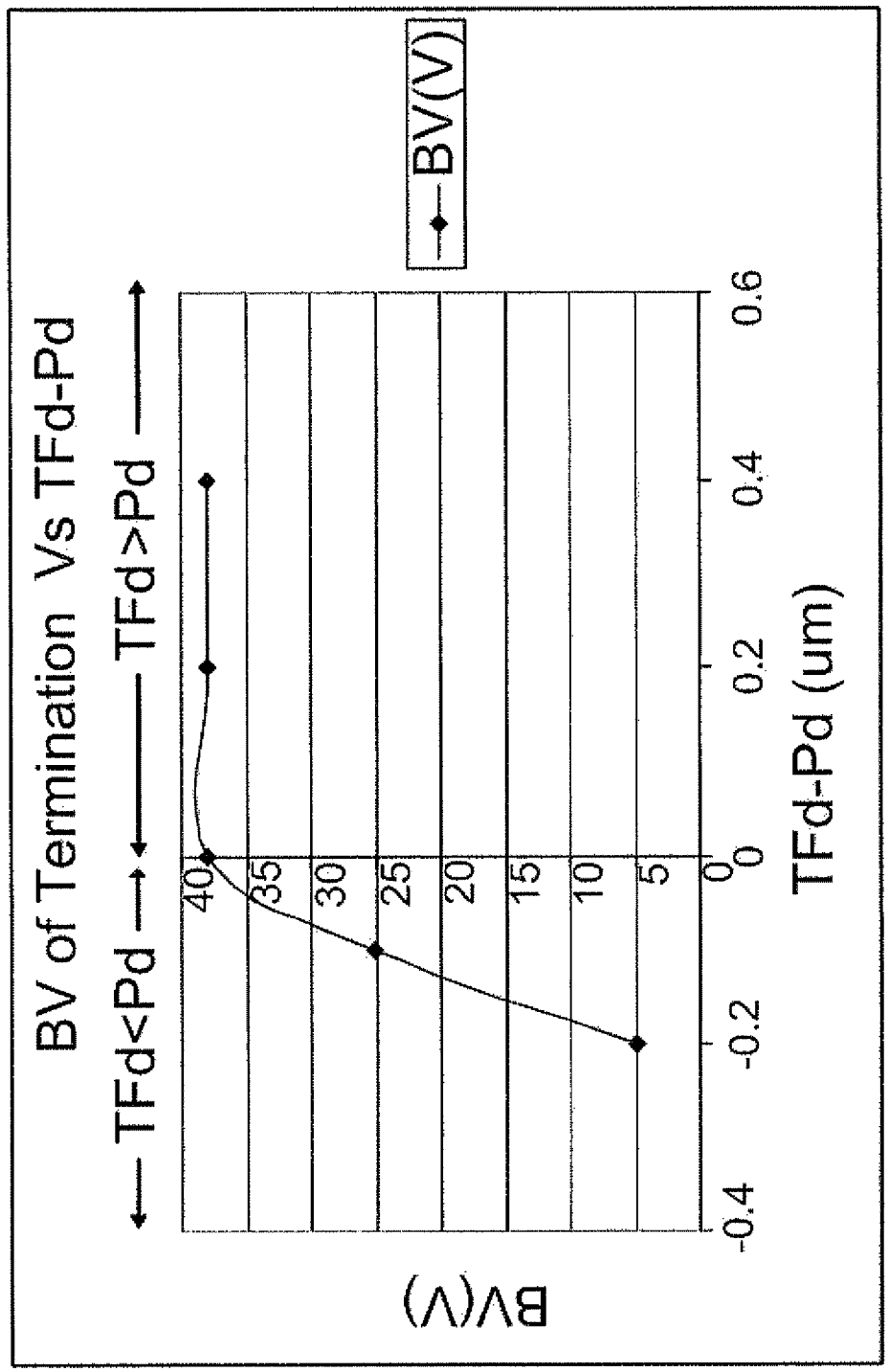
FIG. 2 is an experimental curve showing the relationship between breakdown voltage (BV) and the difference between depth of trenched floating gates and depth of body region (TFd-Pd).
Figure 3:
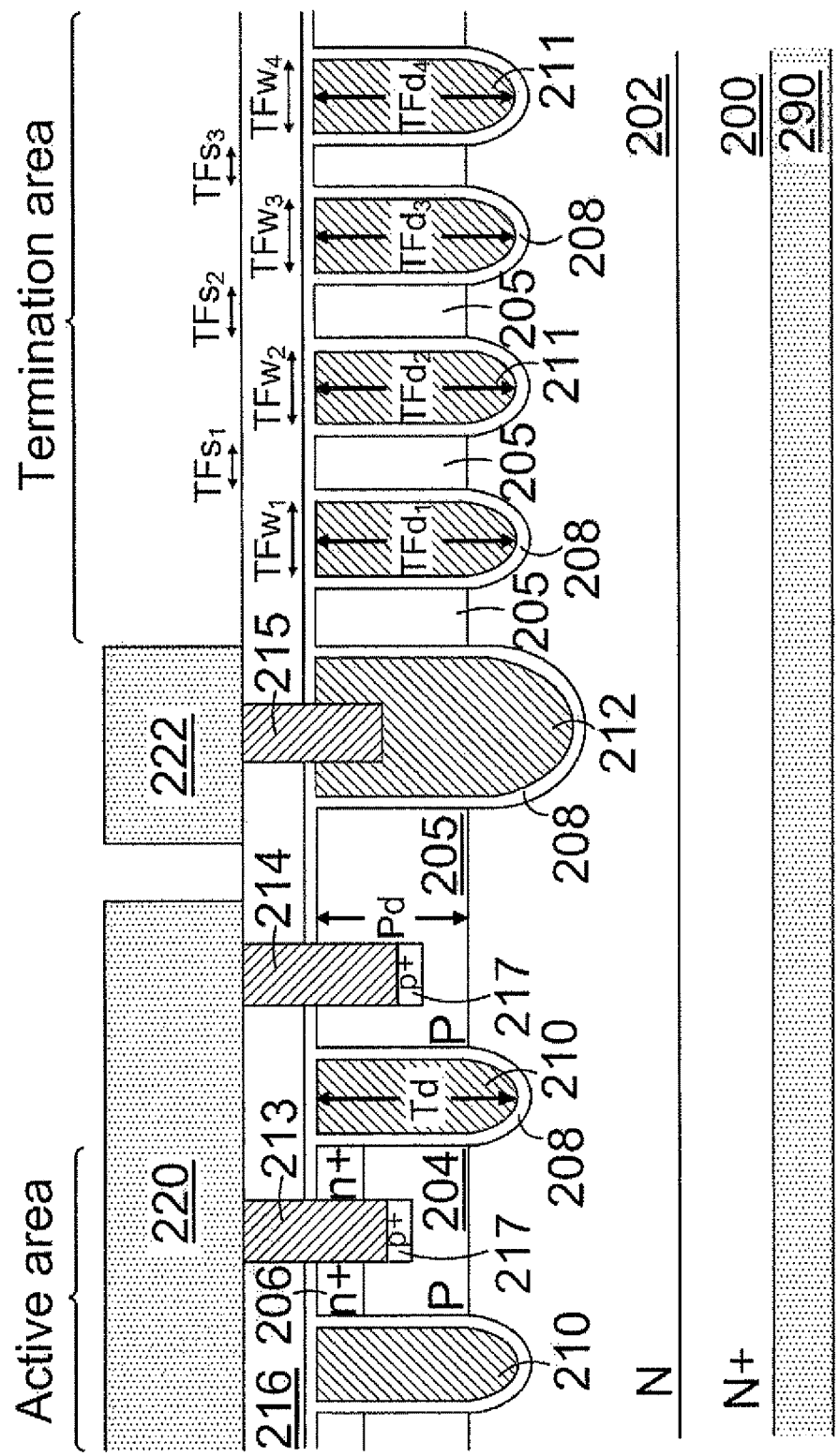
FIG. 3 is a cross-sectional view of a preferred embodiment according to the present invention.

Please refer to FIG. 3 for a preferred embodiment of this invention wherein an N-channel trench MOSFET cell is formed on an N+ substrate 200 with a metal layer 290 on the rear side as drain. Inside an N epitaxial layer 202 onto the N+ substrate 200, a plurality of first type trenched gates 210 are formed in active area, at least a second type trenched gate 212 having greater trench width and depth is formed for gate connection, and a plurality of third type trenched floating gates 211 are formed in termination area. The first type trenched gates 210, the second type trenched gate 212 and the third type trenched floating gates 211 are each filled with a doped poly-silicon layer padded by a gate oxide layer 208 as a single gate electrode. Furthermore, the third type trenched floating gates 211 have same trench width which are the same as the first type trenched gates 210 in the active area, meanwhile, the trench space between every two adjacent of the third type trenched floating gates 211 is in the termination area is equal or increased toward the edge of the termination area. In upper portion of the N epitaxial layer 202, a plurality of first type P body regions 204 are extending between every two adjacent of the first type trenched gates 210; a plurality of second type P body regions 205 are formed around outside the active area. Near top surface of the first type P body regions 204, a plurality of n+ source regions 206 are formed adjacent to sidewalls of the first type trenched gates 210. Specifically, the depth of the third type trenched floating gates 211 ($TFd_1$, $TFd_2$, $TFd_3$ ..., as illustrated in FIG. 3) must be equal or deeper than junction depth of the second type P body regions 205 (Pd, as illustrated in FIG. 3) surrounding the third type trenched floating gates 211 without having the source regions disposed wherein to maintain high breakdown voltage while preventing heavily leakage current, and the depth of the first type trenched gates 210 is deeper than the junction depth of the first type P body regions 204. The N-channel trench MOSFET cell further comprises: a plurality of trenched source-body contacts 213 penetrating a insulation layer 216, the n+ source regions 206 and extending into the first type P body regions 204; a trenched body contact 214 penetrating through the insulation layer 216 and extending into the second type P body region 205 between a first type trenched gate 210 and the adjacent second type trenched gate 212; and at least one trenched gate contact 215 penetrating through the insulation layer 216 and extending into the single gate electrode filled in the at least one second type trenched gate 212. Underneath each of the trenched source-body contact 213 and the trenched body contact 214, there is a p+ body contact region 217 to further reduce contact resistance. The N-channel trench MOSFET cell further comprises source metal 220 and gate metal 222, the source metal 220 is connected to the n+ source regions 206, the first type P body regions 204 and the second type P body region 205 via metal plugs filled into each the trenched source-body contact 213 and the trenched body contact 214, the gate metal 222 is connected to the at least one second trenched gate 212 via metal plugs filled into the trenched gate contact 215. Since the structure does not have n+ source region between two adjacent third type trenched floating gates 211, no current will flow from the drain region through channel region to the source regions 206 in the active area even the third type trenched floating gates are turned on. The N-channel trench MOSFET further comprises a plurality of closed transistor cells, as shown in FIG. 4 or a plurality of stripe transistor cells, as shown in FIG. 5.

Figure 4:
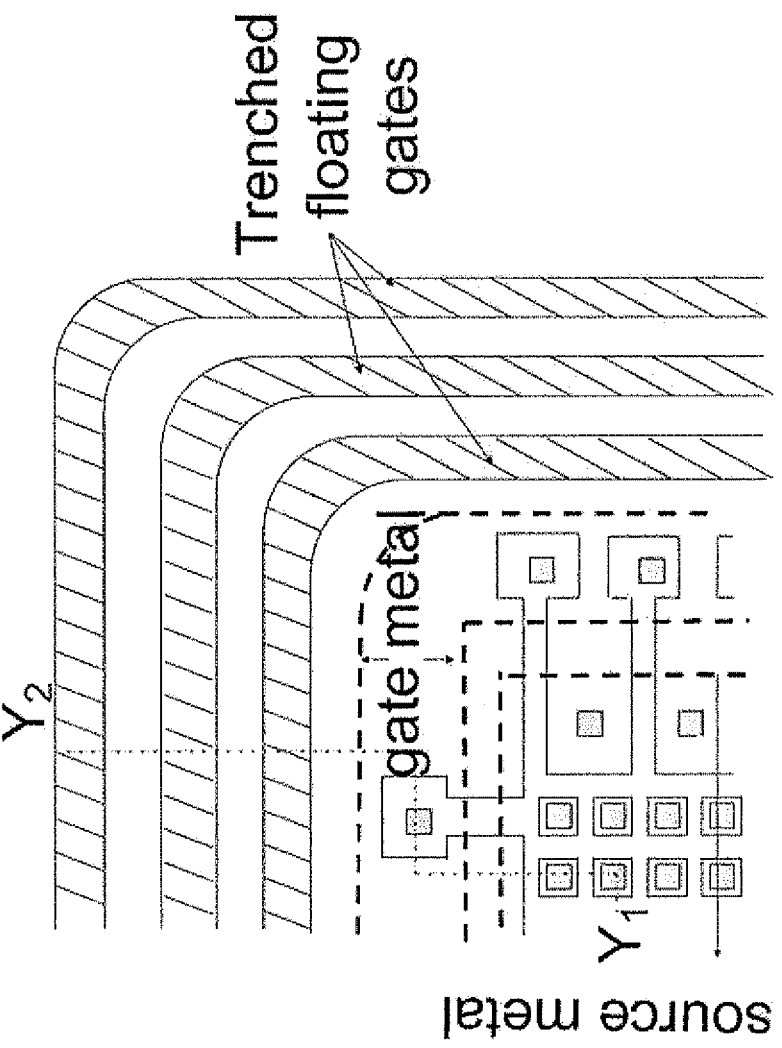
FIG. 4 is a top view of some preferred embodiments having closed cells with trenched floating gates in the termination area according to the present invention.
Figure 5:
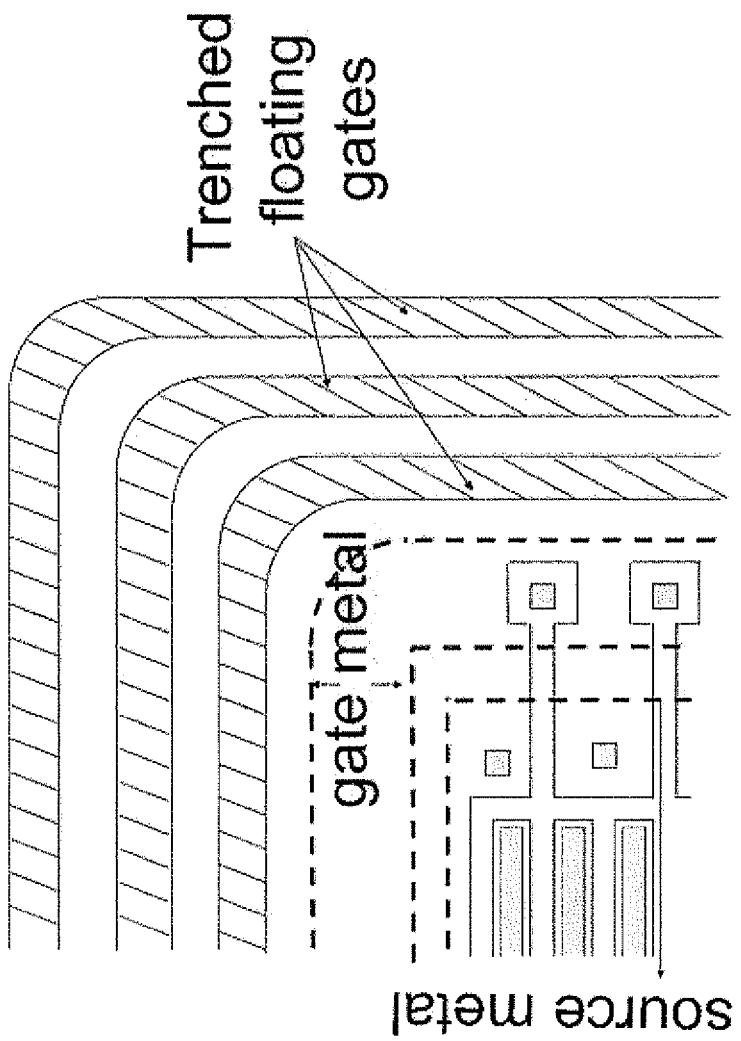
FIG. 5 is a top view of some preferred embodiments having stripe cells with trenched floating gates in the termination area according to the present invention.
Figure 6:
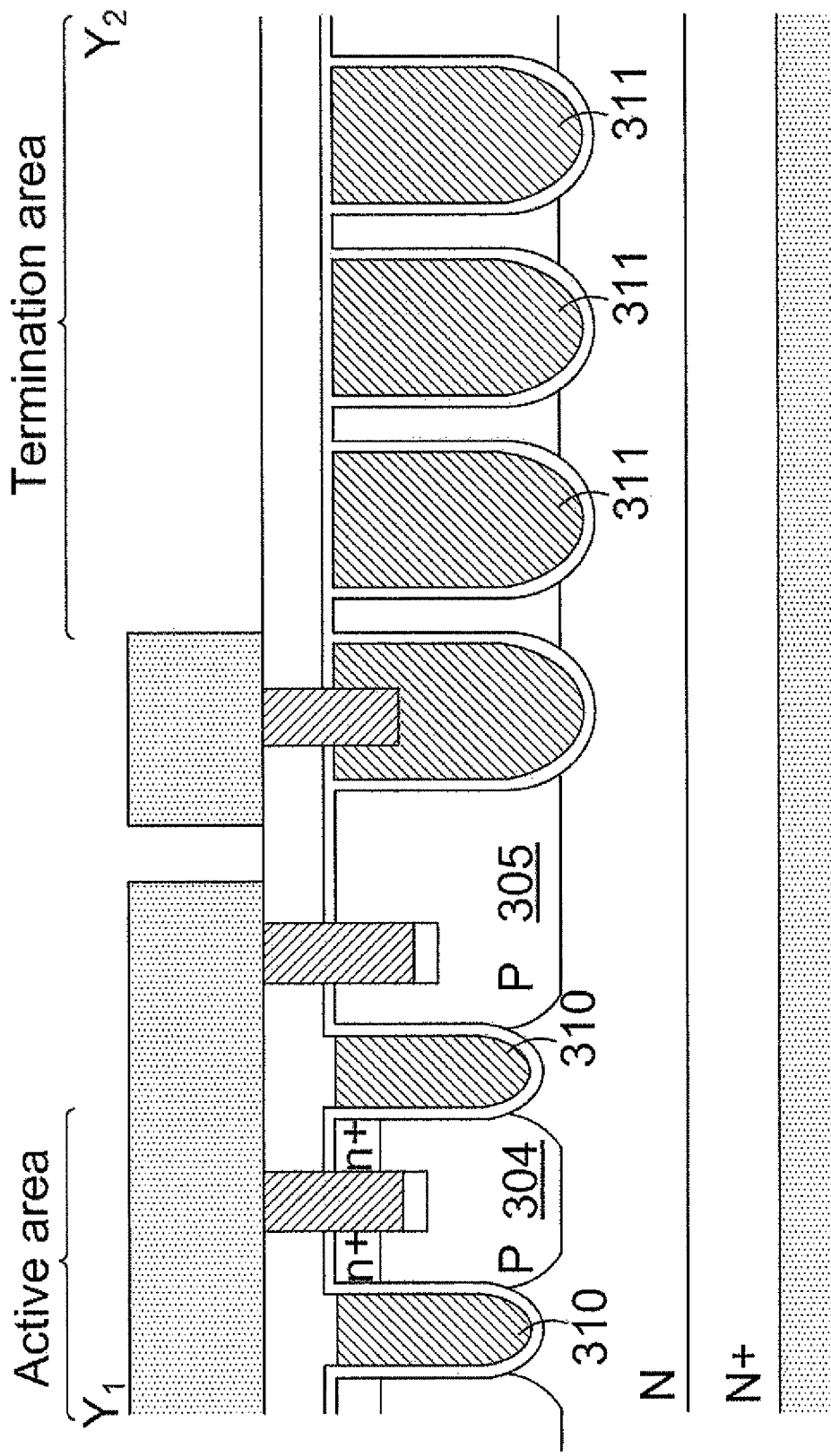
FIG. 6 is a cross-sectional view of another preferred embodiment according to the present invention.
Figure 7:
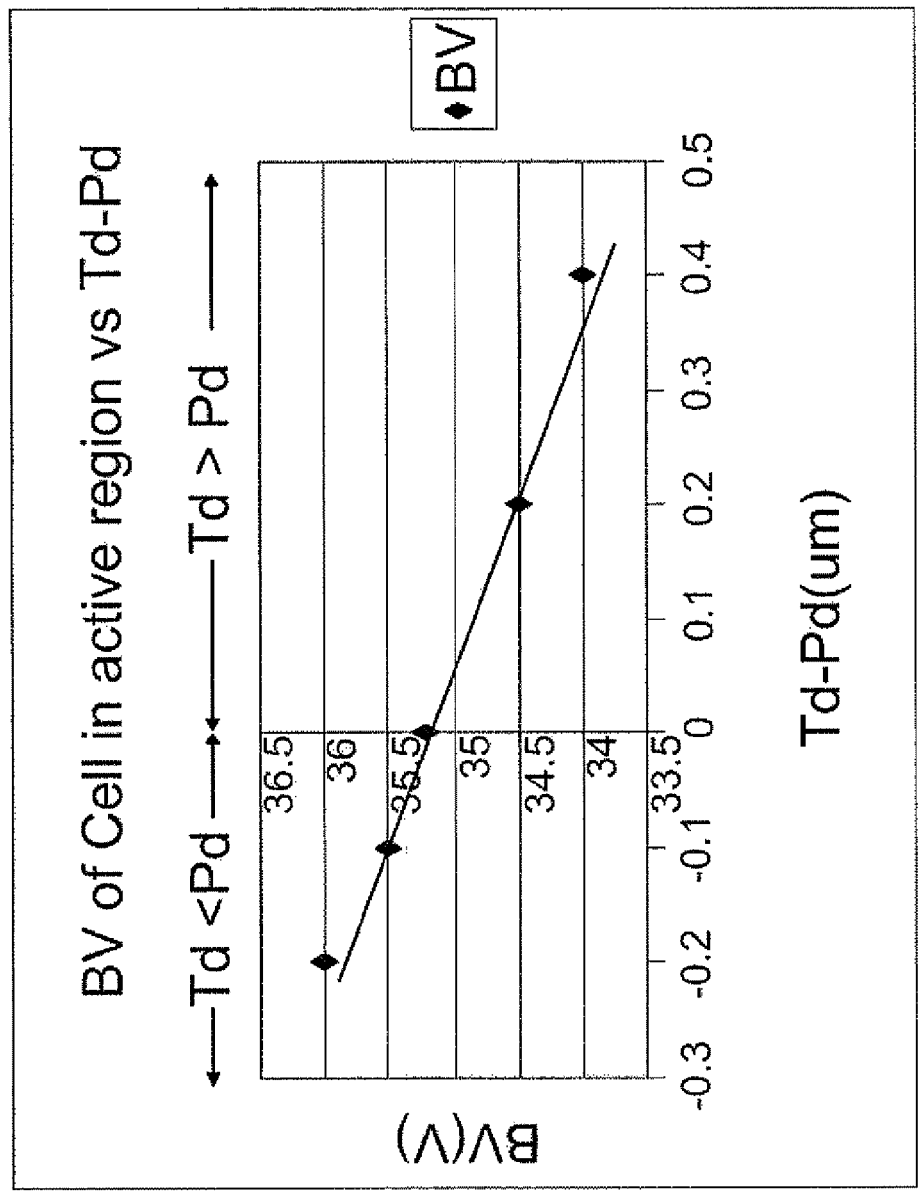
FIG. 7 is an experimental curve showing the relationship between breakdown voltage (BV) in active region and the difference between depth of trenched gates in active region and body region (Td-Pd).
Figure 8:
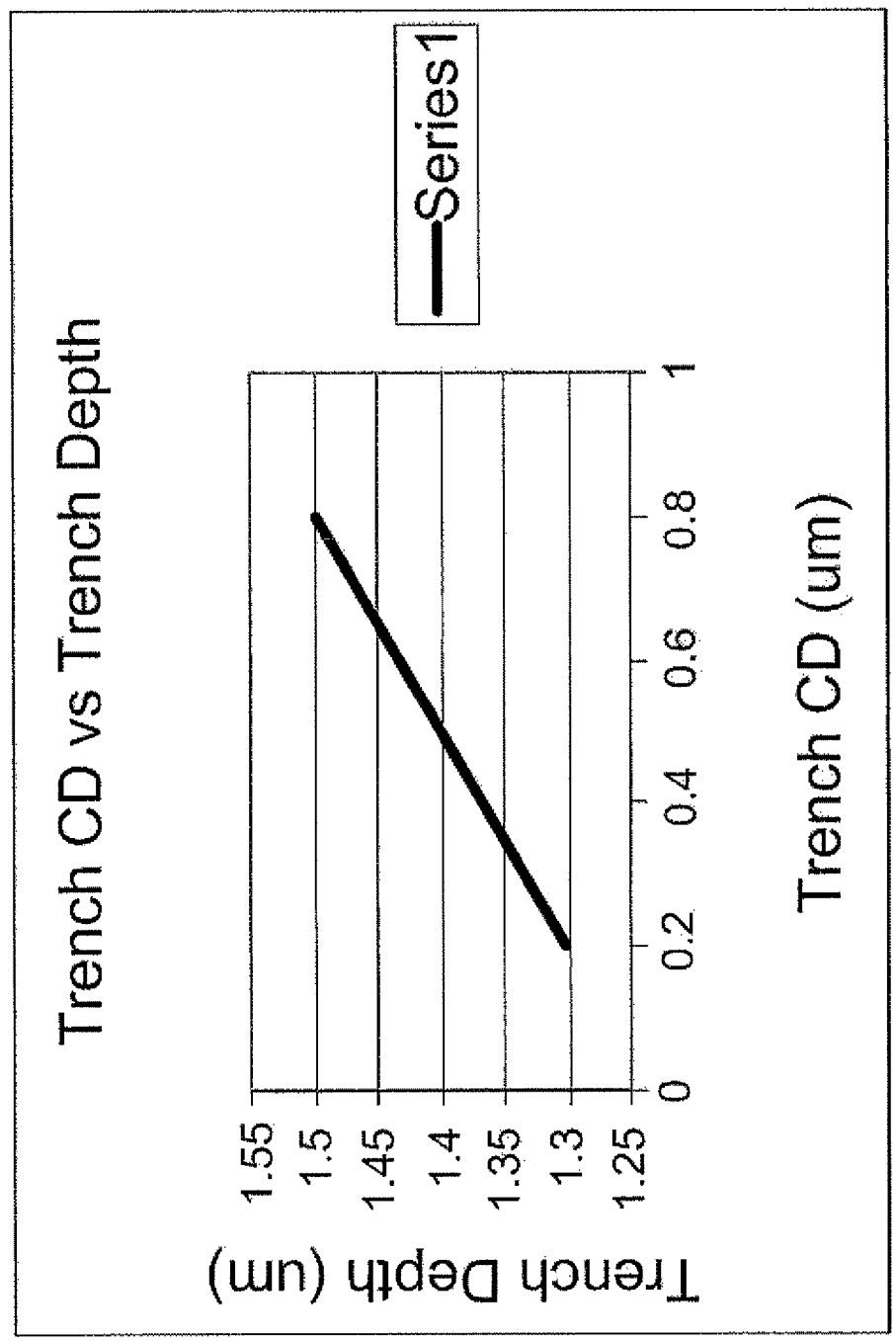
FIG. 8 is an experimental curve showing the relationship between trench CD (Critical Dimension) and trench depth.

FIG. 6 shows another preferred embodiment of the present invention, which is also the $Y_1$-$Y_2$ cross section of FIG. 4, where the disclosed trench MOSFET cell has a similar structure to that in FIG. 3 except that, the multiple of the third type trenched floating gates 311 in the termination area have same trench width ($TFw_1$, $TFw_2$, $TFd_3$ ..., as illustrated in FIG. 3) and trench depth which are greater than the plurality of first type trenched gates 310 in the active area. Meanwhile, the depth of the first type trenched gates 310 (Td, as illustrated in FIG. 3) is shallower than the junction depth of the first type P body regions 304 and the second type P body regions 305 to keep enough breakdown voltage in the active area and lower gate-to-drain charge Qgd for the reason that, as shown in FIG. 7, when Td is deeper, the breakdown voltage is lower in the active area and the Qgd is thus higher. By referring FIG. 8 which shows a relationship between trench depth and trench width, the structure can be achieved with single trench etch because the third type trenched floating gates 311 have trench width greater than the first type trenched gates 310, resulting in deeper trench in the third type trenched floating gates 311 than the first type trenched gates 310. The preferred embodiment has low gate charge due to shallow trench depth while the breakdown voltage is able to be maintained in the termination area without adding extra trench etch.

Figure 9:
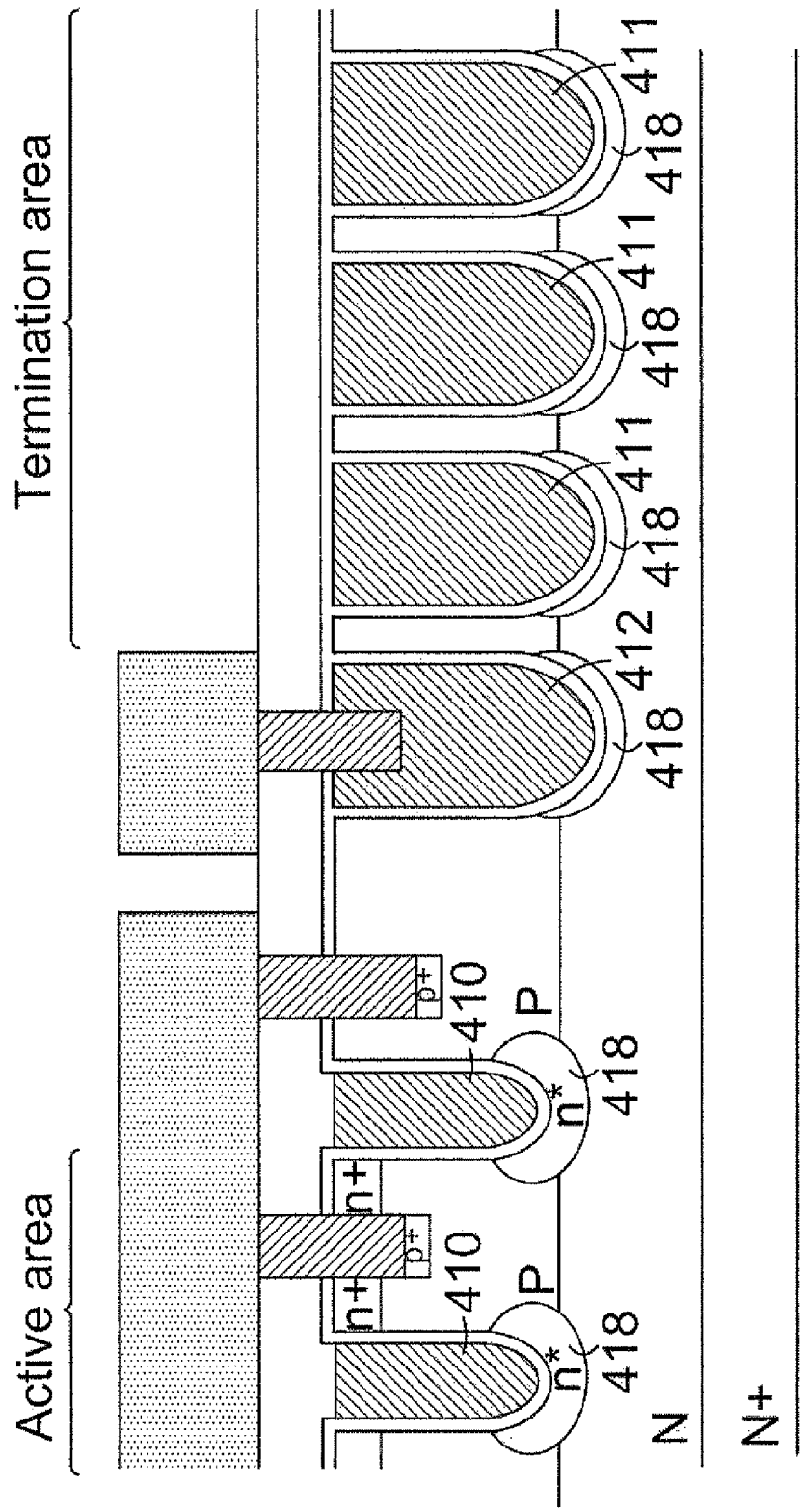
FIG. 9 is a cross-sectional view of another preferred embodiment according to the present invention.

FIG. 9 shows another preferred embodiment of the present invention where the disclosed trench MOSFET cell has a similar structure to that in FIG. 6 except that, there is an n* doped region 418 wrapping bottom of each of the first type trenched gates 410, the at least one second type trenched gate 412 and the multiple of the third type trenched floating gates 411 to further reduce drain-to-source resistance Rds.

Figure 10:
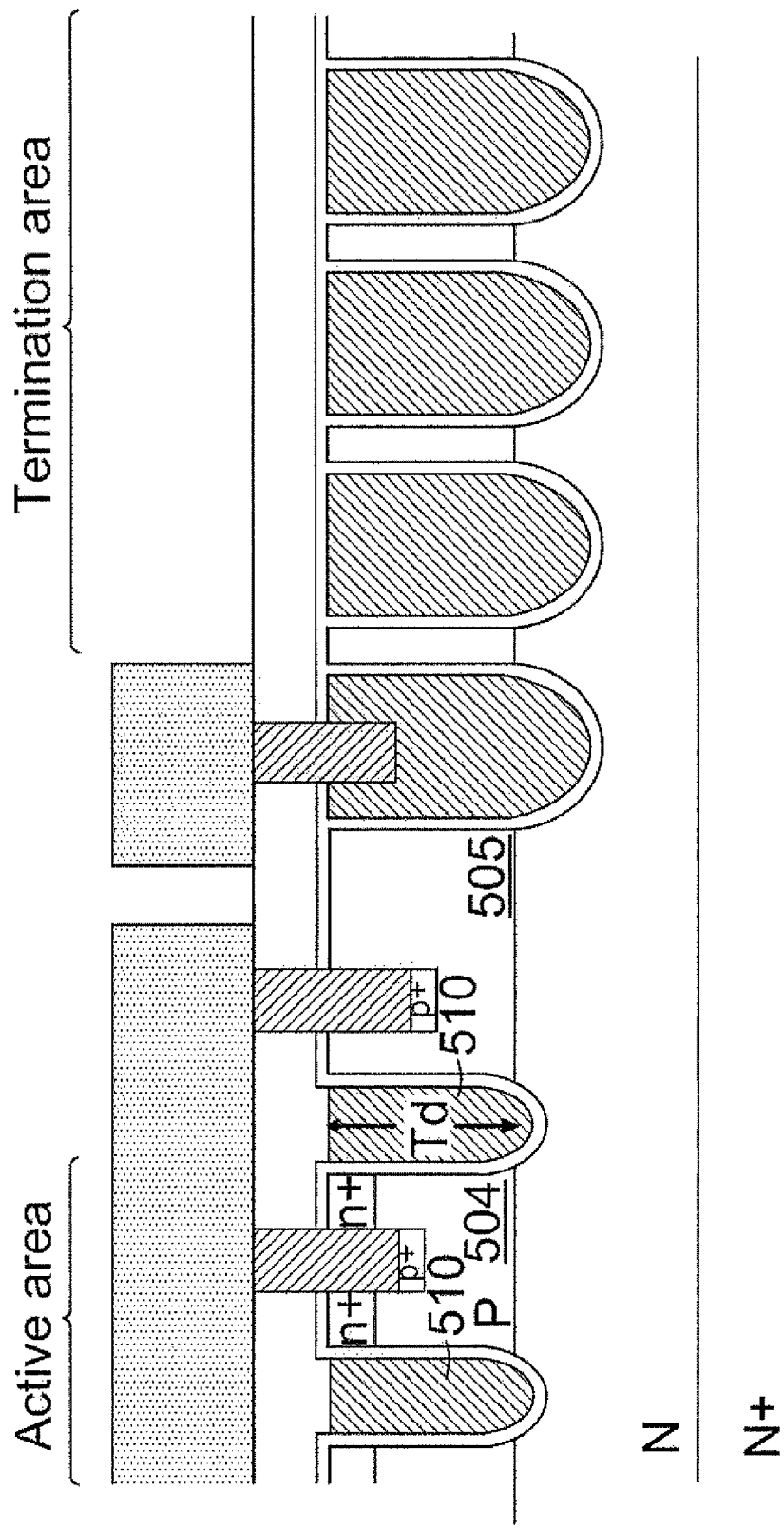
FIG. 10 is a cross-sectional view of another preferred embodiment according to the present invention.

FIG. 10 shows another preferred embodiment of the present invention wherein the disclosed trench MOSFET cell has a similar structure to that in FIG. 6 except that, the depth of the first type trenched gates 510 in the active area is greater than the first type P body regions 504 and the second type P body regions 505.

Figure 11:
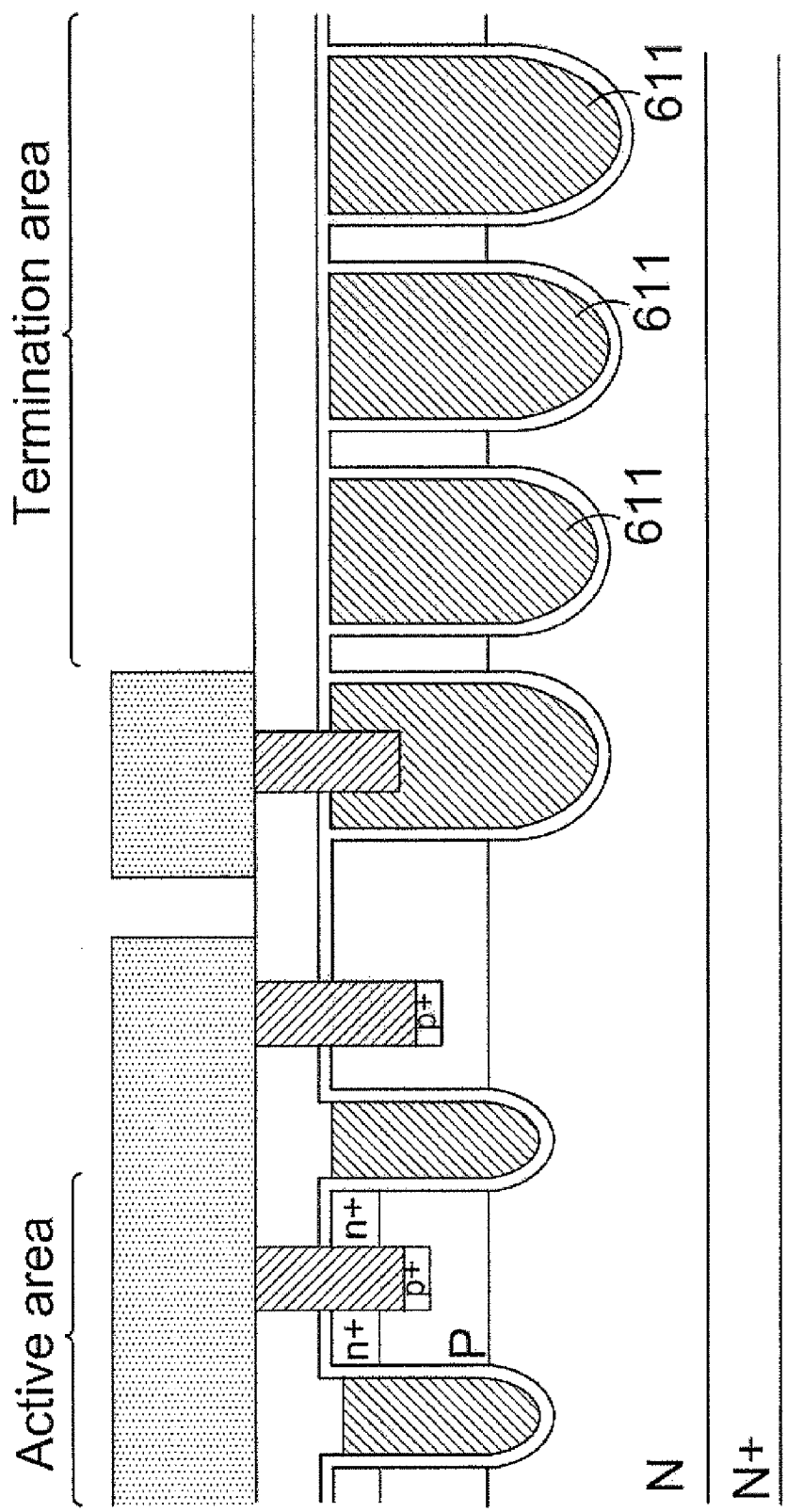
FIG. 11 is a cross-sectional view of another preferred embodiment according to the present invention.

FIG. 11 shows another preferred embodiment of the present invention where the disclosed trench MOSFET cell has a similar structure to that in FIG. 10 except that, in the termination area, the multiple of third type trenched floating gates 611 have different trench depth and trench width which are both greater than the plurality of first type trenched gates 610 in the active area. More specifically, the trench width of the multiple of the third type trenched floating gates 611 increases toward the edge of the termination area (TFw$_1$<TFw$_2$<TFw$_3$ . . . ), which indicates that, the depth of the multiple of the third type trenched floating gates 611 also increases toward the edge of the termination area (TFd$_1$<TFd$_2$<TFd$_3$ . . . ) according to FIG. 8. Alternatively, the depth of the multiple of the third type trenched floating gates 611 decreases toward the edge of the termination area (TFw$_1$>TFw$_2$>TFw$_3$ . . . ).

Figure 12:
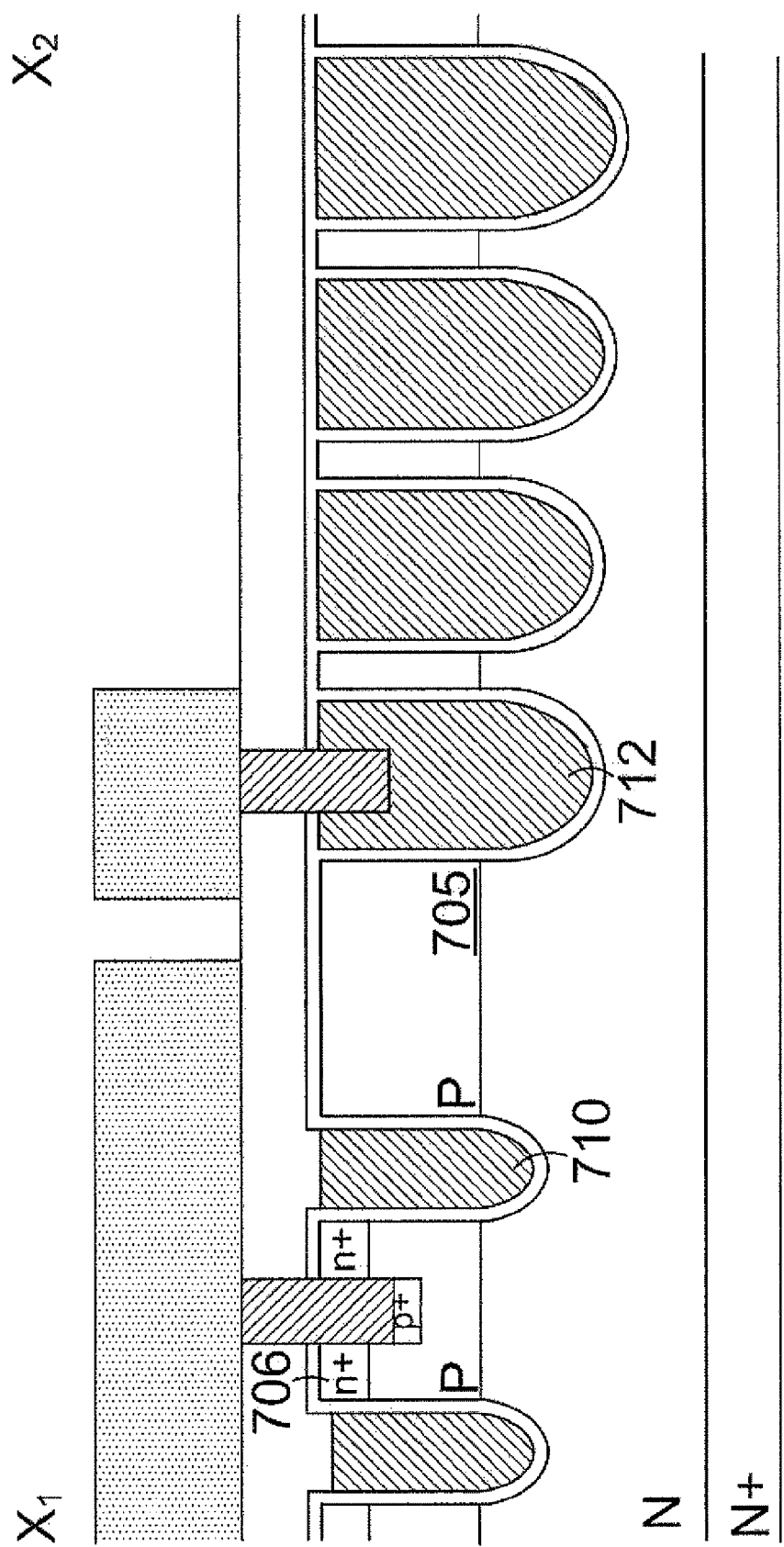
FIG. 12 is a cross-sectional view of another preferred embodiment according to the present invention.
Figure 13:
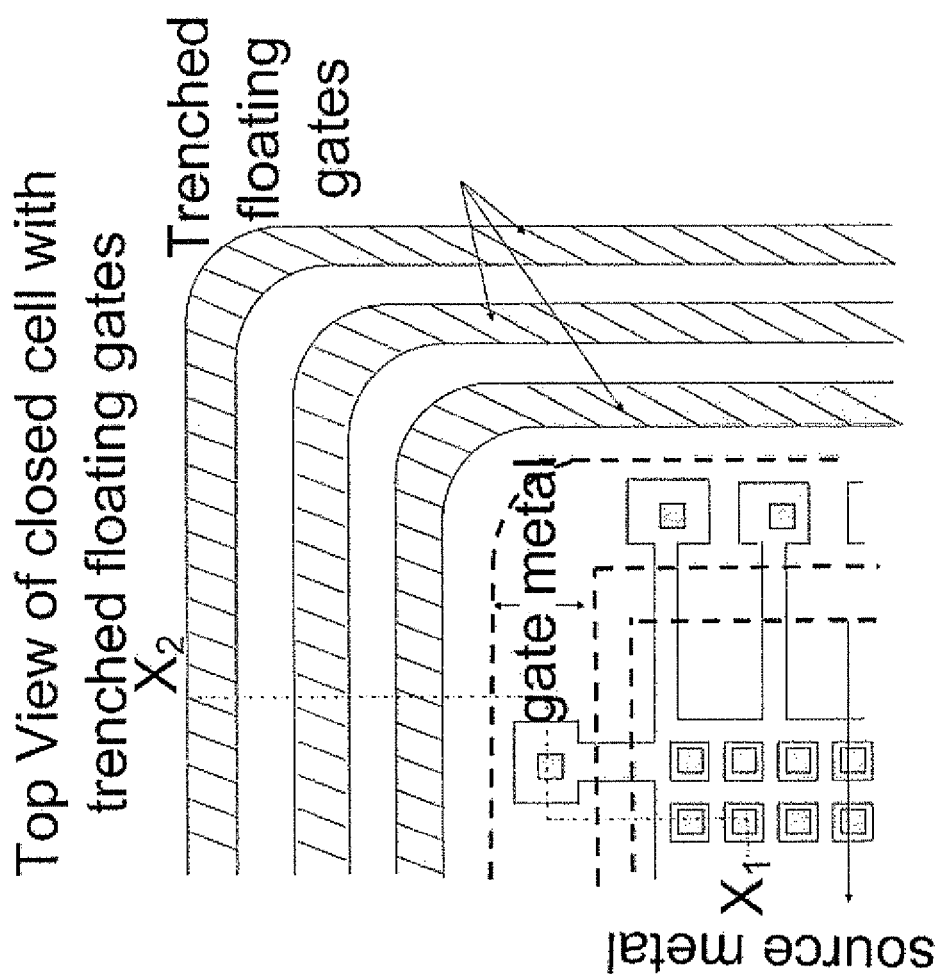
FIG. 13 is a top view of some preferred embodiments having closed cells without trenched body contact according to the present invention.
Figure 14:
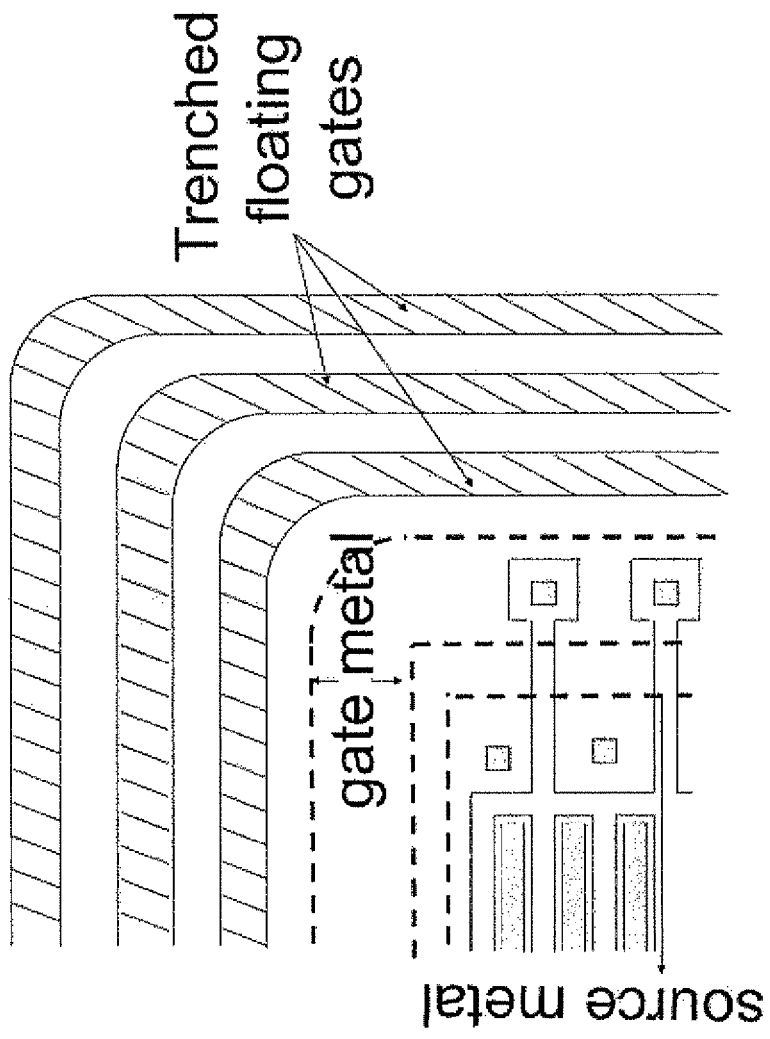
FIG. 14 is a top view of some preferred embodiment having stripe cells without trenched body contact according to the present invention.

FIG. 12 shows another preferred embodiment of the present invention, which is also the X$_1$-X$_2$ cross section in FIG. 13, wherein the disclosed trench MOSFET cell has a similar structure to that in FIG. 11 except that, there is no trenched body contact extending into the second type P body region 705 so that the second type P body region 705 between a first trenched gate 719 and the adjacent second type trenched gate 712 is not connected to the n+ source regions 706 and having floating voltage. The N-channel trench MOSFET further comprises a plurality of closed transistor cells, having top view as shown in FIG. 13 or a plurality of stripe transistor cells, having top view as shown in FIG. 14.

Figure 15:
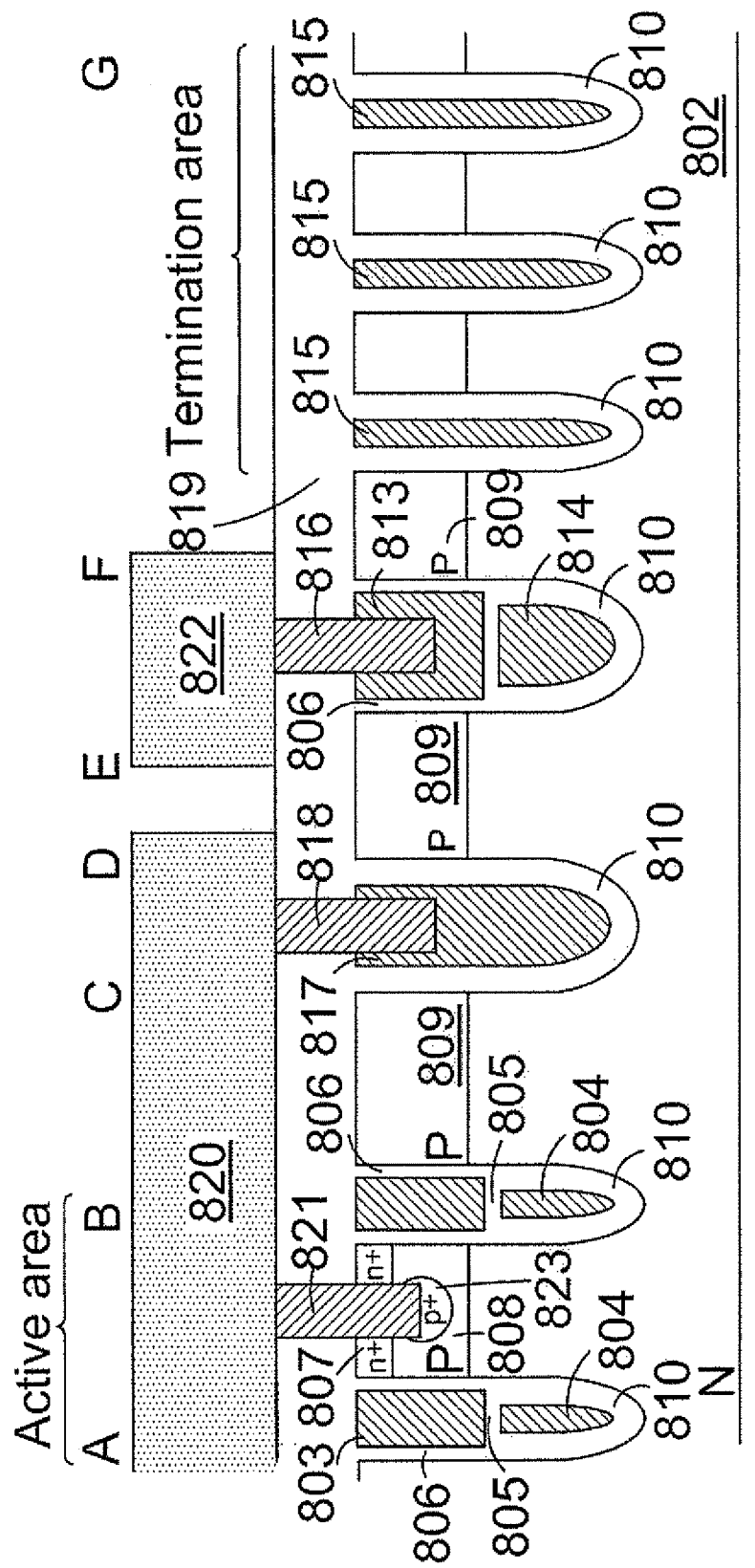
FIG. 15 is a cross-sectional view of anther preferred embodiment according to the present invention.
Figure 17:
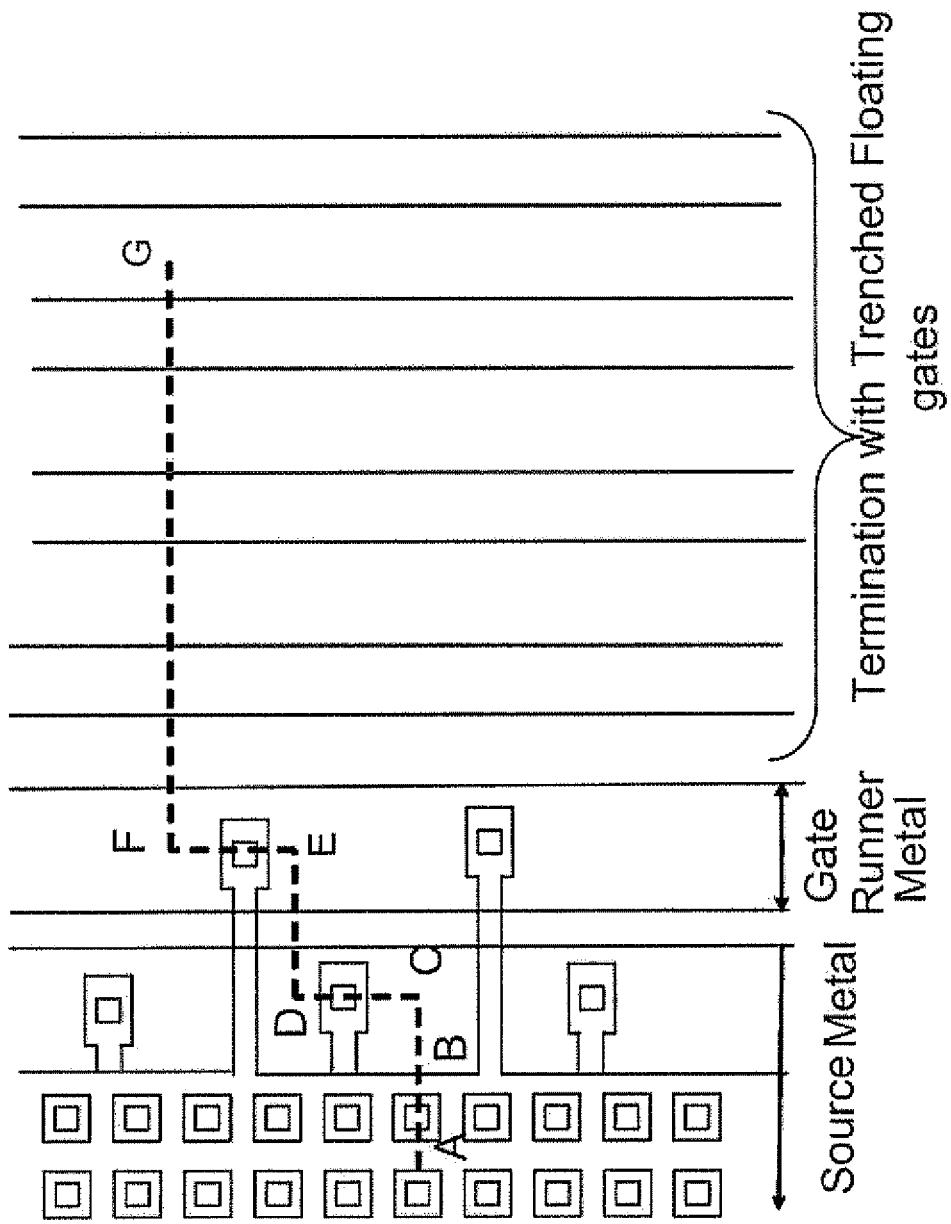
FIG. 17 is a top view of some preferred embodiments having closed cells according to the present invention.

FIG. 15 shows another preferred embodiment of the present invention, which is also a preferred A-B-C-D-E-F-G cross section in FIG. 17. Compared to FIG. 3, the N-channel trench MOSFET in FIG. 15 has shielded trenched gates in the active area and at least a wider shielded trenched gate for trench connection, while the trenched floating gates in the termination area still filled with single electrode. In the active area, each of the shielded trenched gates comprises: a gate electrode 803 disposed in the upper portion; a shielded electrode 804 disposed in lower portion, wherein the gate electrode 803 and the shielded electrode 804 is insulated from each other by an inter-electrode insulation layer 805; a first type gate oxide layer 806 formed along upper sidewalls of each the shielded trenched gates and adjacent to the gate electrode 803 to insulate the gate electrode 803 from the n+ source region 807, the first type P body region 808 and the second type P body region 809, wherein the n+ source region 807 has uniform doping concentration and junction depth along the top surface of the N epitaxial layer 802, or has doping concentration of Gaussian-distribution from edge of trenched source-body contact 821 to adjacent channel region and shallower junction depth near the channel region than near the edge of the source-body contact 821; a second type gate oxide layer 810 formed along bottom and lower sidewalls of each the shielded trenched gate and adjacent to the shielded electrode 804 to insulate the shielded electrode 804 from the N epitaxial layer 802, wherein the second type gate oxide layer 810 has greater thickness than the first type gate oxide layer 806. Meanwhile, a plurality of the trenched source-body contact 821 with each filled with metal plug is formed penetrating through an insulation layer 819, the n+ source regions 807 and extending into the first type P body region 808 with a p+ body contact region 823 formed surrounding bottom of each the trenched source-body contact 821. The wider shielded trenched gate for gate connection comprises: a gate electrode 813 disposed in the upper portion; a shielded gate electrode 814 in the lower portion, wherein the gate electrode 813 and the shielded gate electrode 814 is insulated from each other by the inter-electrode insulation layer 805; the first type gate oxide layer 806 formed along upper sidewalls of the wider shielded trenched gate and adjacent to the gate electrode 813 to insulate the shielded electrode 813 from the second type P body region 809; the second type gate oxide layer 810 formed along bottom and lower sidewalls of the wider shielded trenched gate and adjacent to the shielded electrode 814 to insulate the shielded electrode 814 from the N epitaxial layer 802. Furthermore, a trenched gate electrode contact 816 filled with the metal plug is extending into the gate electrode 813 in the wider shielded trenched gate, wherein the metal plug is padded by a barrier layer and is contacting with the gate metal 822. In the termination area, the plurality of trenched floating gates having floating voltage each comprises a single electrode 815 onto the second type gate oxide layer 810 which lined each of the trenched floating gates. This preferred embodiment further comprises a wider trenched gate filled with a single electrode 817 onto the second type gate oxide layer 810; a trenched shielded electrode contact 818 filled with the metal plug penetrating through the insulation layer 819 and extending into the single electrode 817, wherein the metal plug is padded by the barrier layer and is contacting with the source metal 820.

Figure 16:
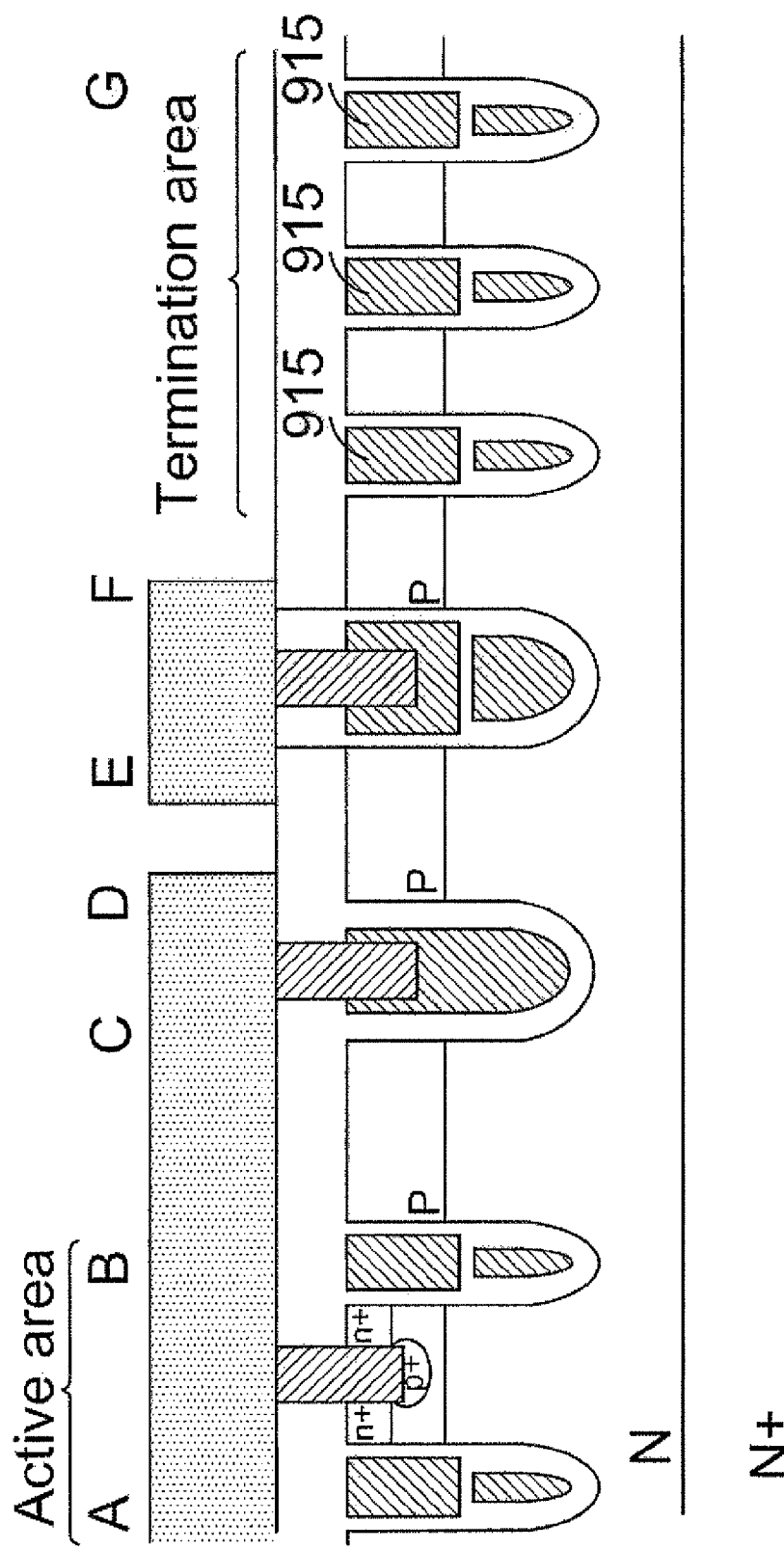
FIG. 16 is a cross-sectional view of another preferred embodiment according to the present invention.
Figure 18:
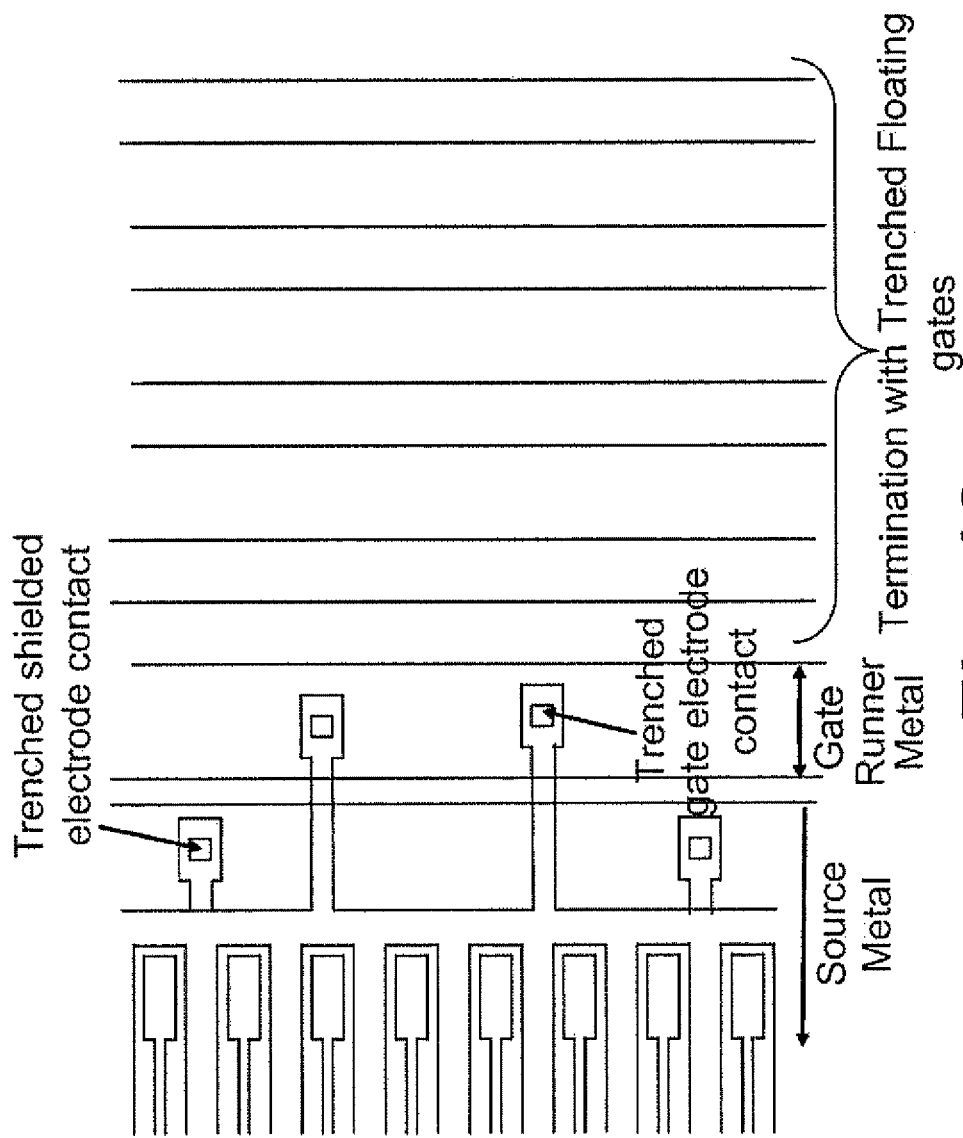
FIG. 18 is a top view of some preferred embodiment having stripe cells according to the present invention.

FIG. 16 shows another preferred embodiment of the present invention, which is also a preferred A-B-C-D-E-F-G cross section in FIG. 17, which has a similar structure to that in FIG. 15 except that, in the termination area, the multiple of the trenched floating gates having floating gate electrodes 915 are implemented by using shielded trenched gates which are the same as the first type trenched gates in the active area. The N-channel trench MOSFET further comprises a plurality of closed transistor cells, as shown in FIG. 17 or a plurality of stripe transistor cells, as shown in FIG. 18.

Figure 19A:
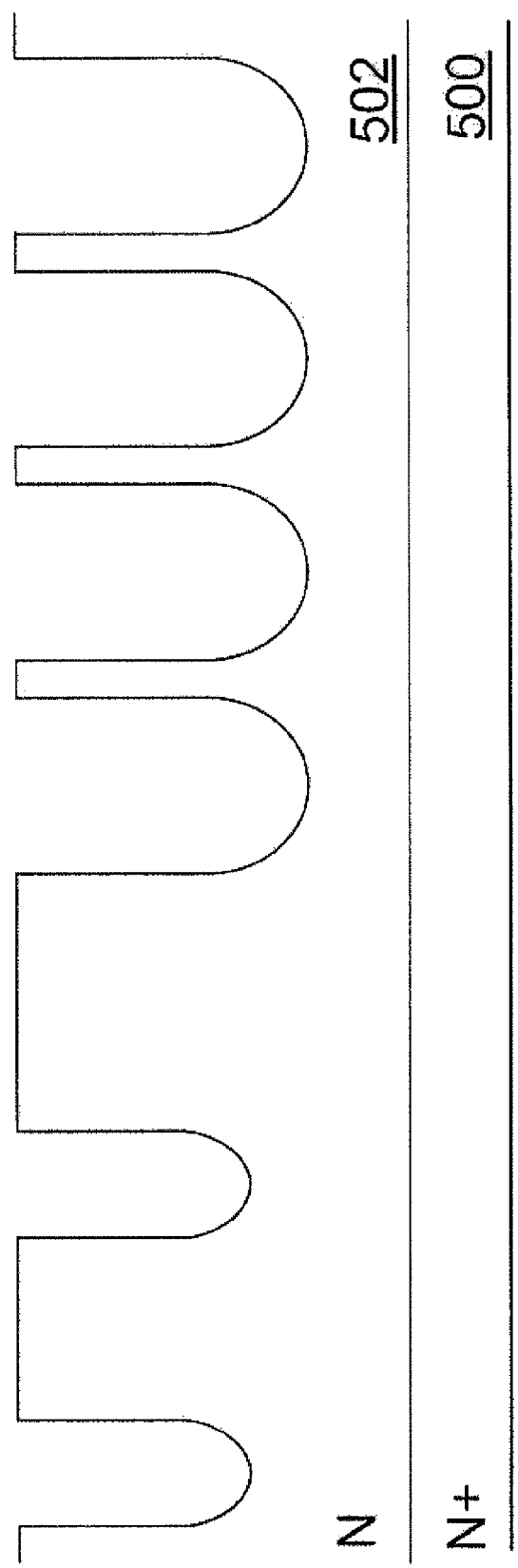
FIGS. 19A~19E are a serial of side cross-sectional views for showing the processing steps for fabricating the trench MOSFET with wide trenched floating gates as termination as shown in FIG. 10.
Figure 19B:
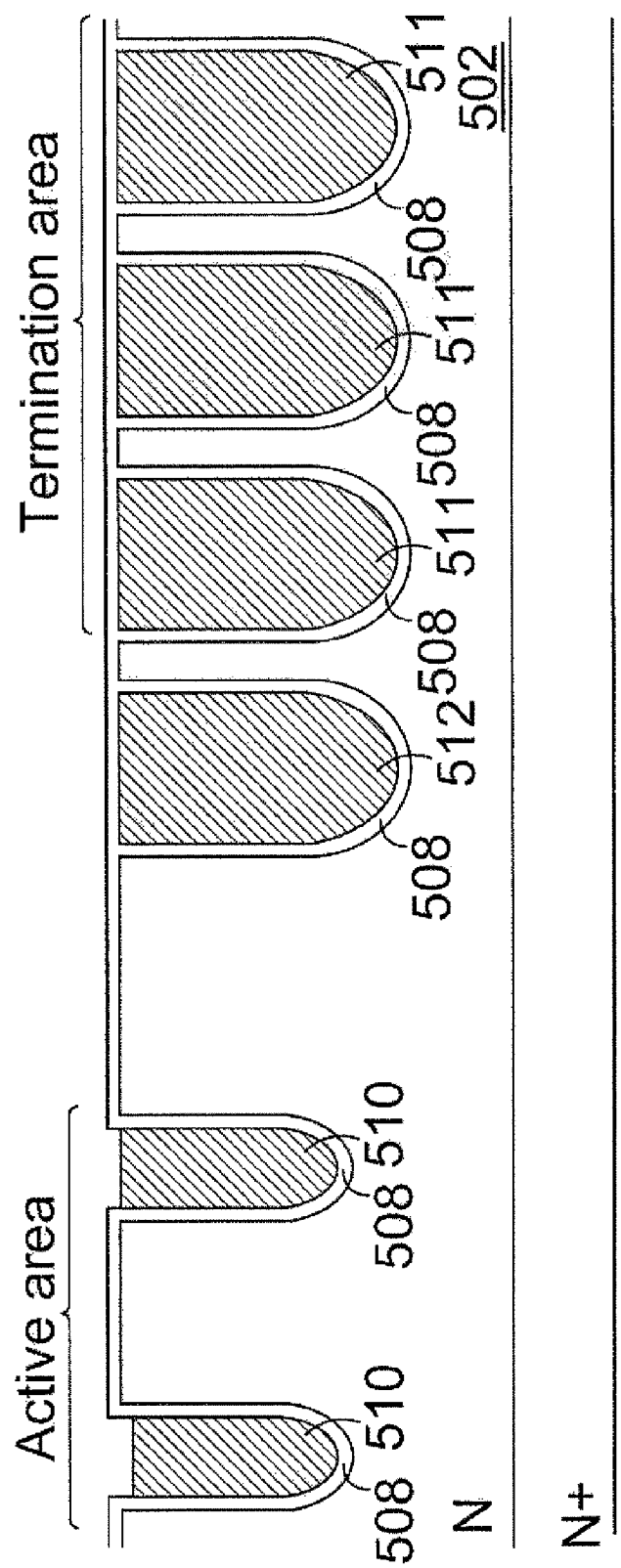

FIG. 19A to 19E area a series of exemplary steps that are performed to form the inventive trench MOSFET with trenched floating gates as termination area in FIG. 10. In FIG. 19A, an N doped epitaxial layer 502 is grown on an N+ doped substrate 500. A trench mask (not shown) is applied onto the N epitaxial layer 502 for the formation of a plurality of gate trenches by dry silicon etching. The most important is that, the gate trenches in the active area and in the termination area are etched in different openings to make different trench depths, and the gate trenches in the termination area are deeper and wider than gate trenches in the active area. In FIG. 19B, a sacrificial oxide (not shown) is first grown and then removed to eliminate the plasma damage introduced during opening those gate trenches in FIG. 19A. After that, a gate oxide 508 is formed along the inner surface of all gate trenches and the top surface of the N epitaxial layer 502 between every two adjacent gate trenches. Then, onto the gate oxide 508, doped poly-silicon layer is deposited and then etched back by CMP (Chemical Mechanical Polishing) or plasma etching to fill all the gate trenches to form a plurality of first type trenched gates 510 in the active area, at least a wider second type trenched gate 512 for gate connection and a plurality of third type trenched floating gates 511 in the termination area.

Figure 19C:
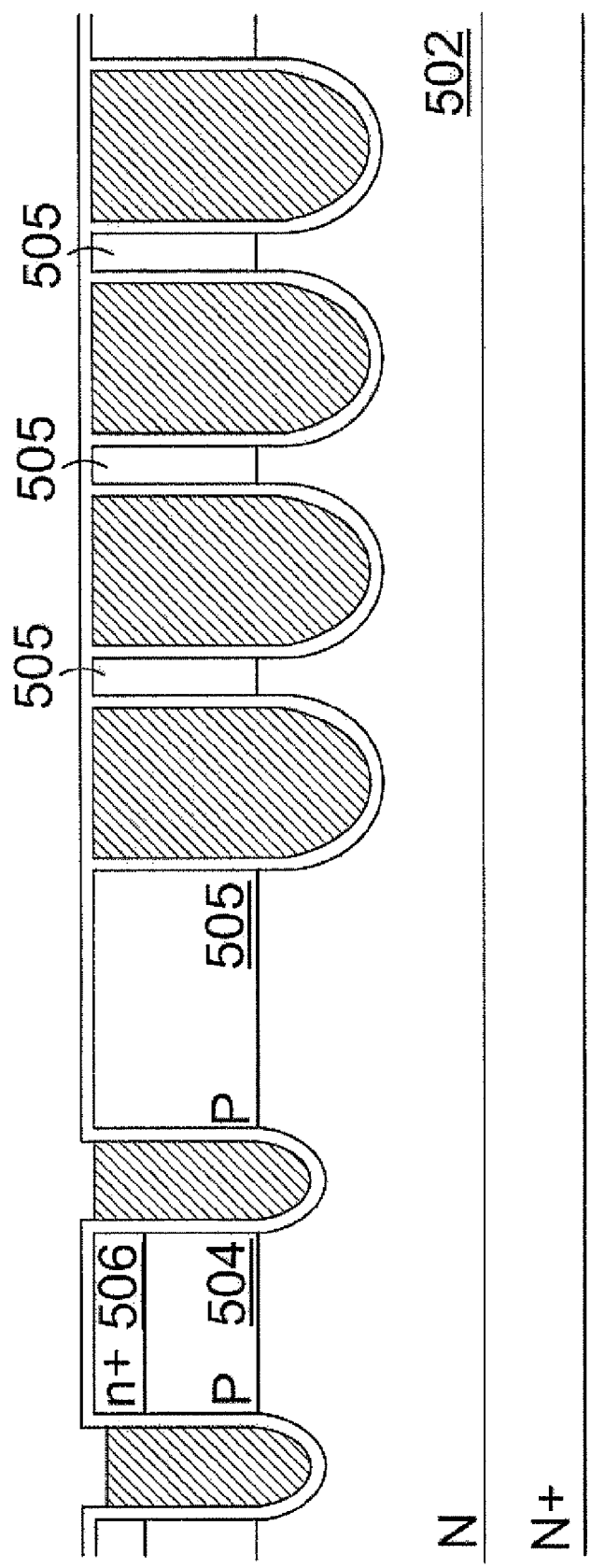

In FIG. 19C, an ion implantation of P type dopant is carried out to form the first type P body regions 504 and the second type P body regions 505 in upper portion of the N epitaxial layer 502 by a P dopant diffusion. Then, after applying a source mask (not shown), another ion implantation of N type dopant is carried out to form the n+ source regions 506 near top surface of the first type P body regions 504 in the active area.

Figure 19D:
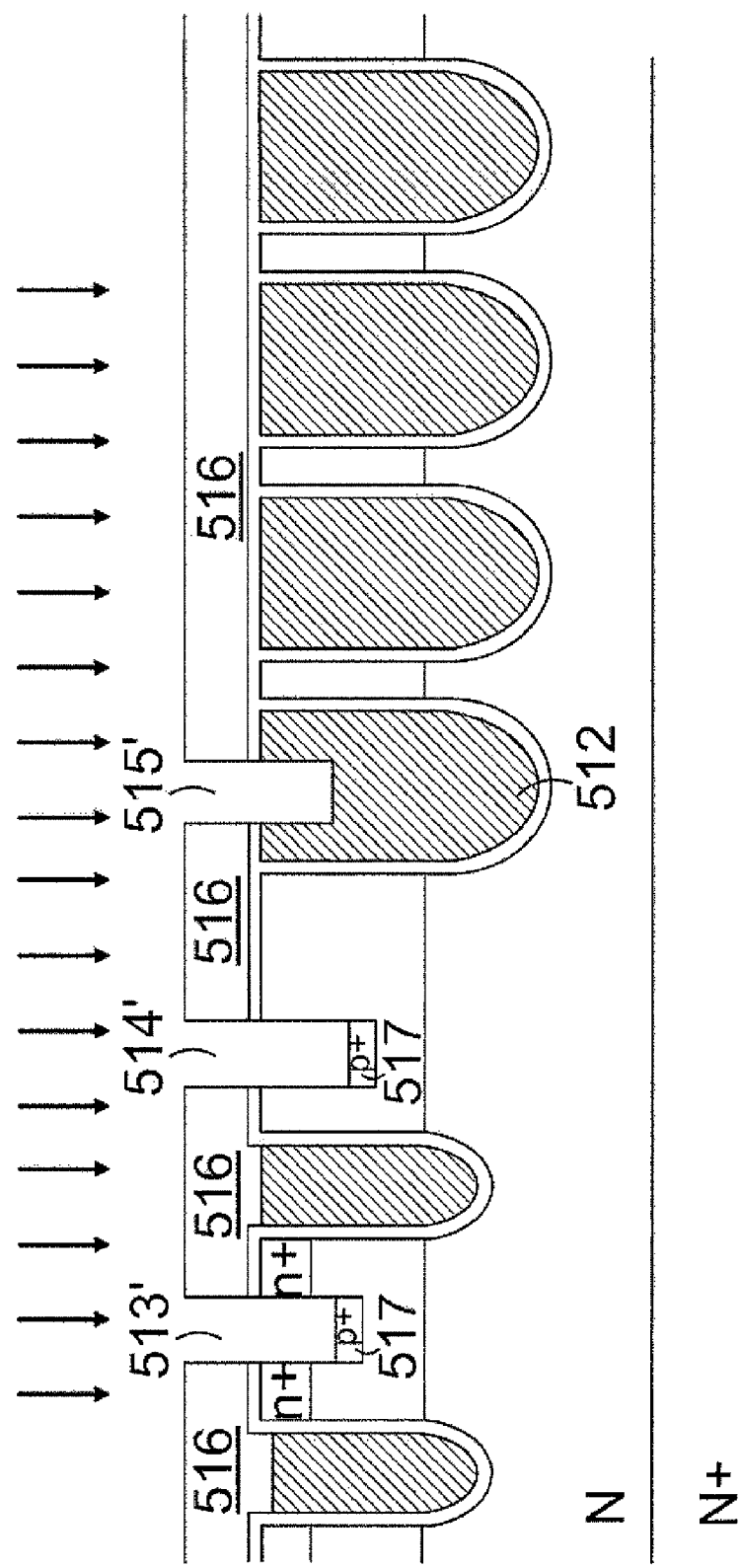

In FIG. 19D, a thick insulation layer 516 is deposited on top of the N-channel MOSFET cell, then after forming a contact mask (not shown), a plurality of contact trenches are formed. Among those contact trenches, a plurality of contact trenches 513' are etched through said insulation layer 516, the n+ source regions 506 and extending into the first type P body region 504; at least a contact trench 514' is etched through the insulation layer 516 and extending into the second type P body region 505; at least a contact trench 515' is etched through the insulation layer 516 and extending into the doped poly-silicon layer in the at least a second type trenched gate 512. Then, a blank ion implantation of P type dopant is carried out to form p+ body contact region 517 underneath each trench bottom of the contact trench 513' and the contact trench 514'.

Figure 19E:
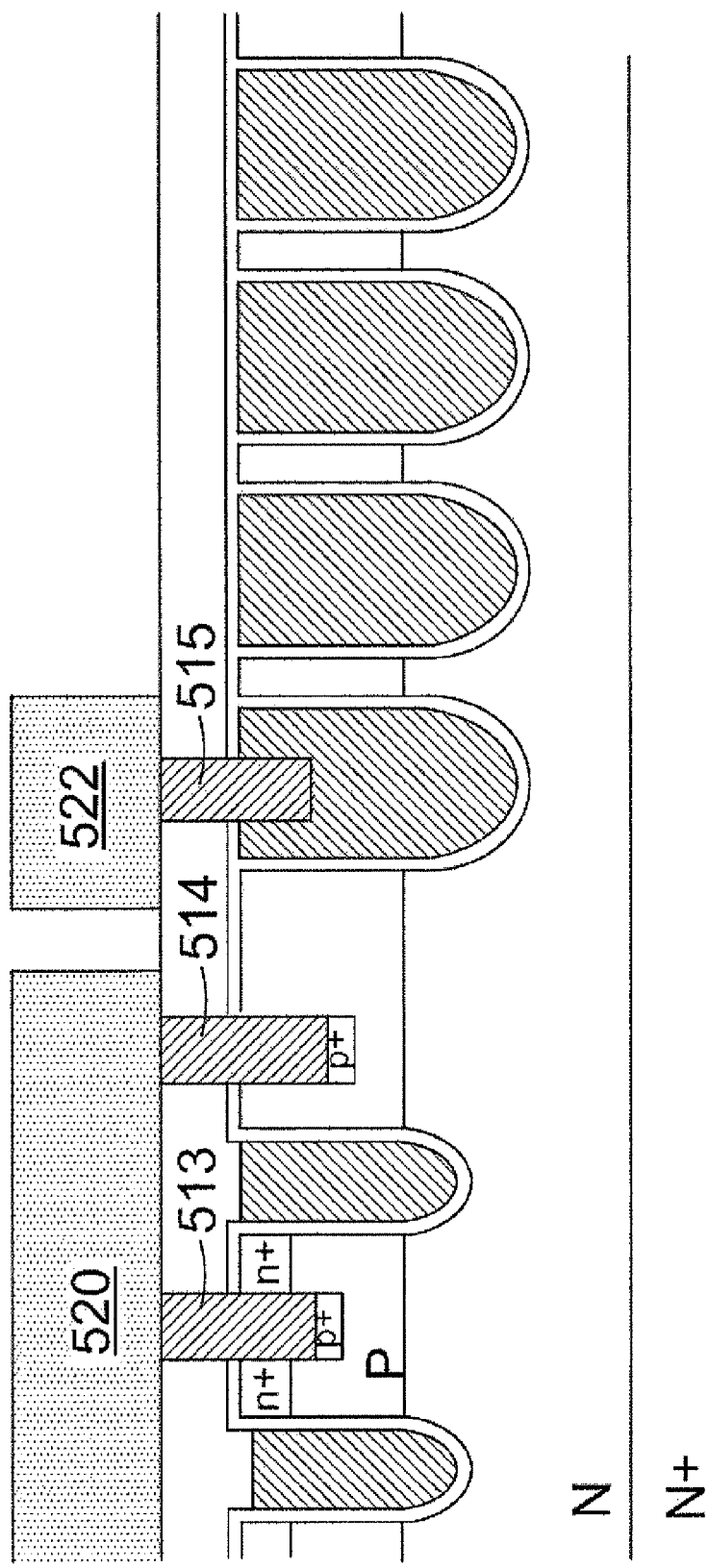

In FIG. 19E, after the deposition of a barrier layer of Ti/TiN or Co/TiN or Ta/TiN, tungsten metal is deposited filling all the contact trenches 513' to from trenched source-body contact 513, and filling said at least a contact trench 514' and 515' to form trenched body contact 514 and trenched gate contact 515. Then, a resistance reduction metal layer Ti or Ti/TiN and a front metal layer are successively deposited and patterned by a metal mask (not shown) to form source metal 520 and gate metal 522.

Although the present invention has been described in terms of the presently preferred embodiments, it is to be understood that such disclosure is not to be interpreted as limiting. Various alternations and modifications will not doubt become apparent to those skilled in the art reading the above disclosure. Accordingly, it is intended that the appended claims be interpreted as covering all alternations and modifications as fall within the true spirit and scope of the invention.

What is claimed is:

1. A trench MOSFET with a plurality of transistor cells in active area and multiple trenched floating gates in termination area, comprising:
a substrate of a first conductivity type;
an epitaxial layer of said first conductivity type grown on said substrate, said epitaxial layer having a lower doping concentration than said substrate;
a plurality of source regions of said first conductivity type formed near top surface of said epitaxial layer only within said active area, said source regions having a doping concentration higher than said epitaxial layer;
a plurality of first type body regions of a second conductivity type formed beneath said source regions in said active area;
a plurality of second type body regions of said second conductivity type formed into said epitaxial layer from top surface of said epitaxial layer around outside of said active area including said termination area;
said source regions being not disposed in the top of said second type body regions;
an insulation layer formed on said epitaxial layer;
a plurality of shielded trenched gates in said active area, wherein each said shielded trenched gate comprising a gate electrode disposed in the upper portion and a shielded electrode disposed in the lower potion, wherein said gate electrode and said shielded electrode insulated from each other by an inter-electrode insulation layer;
said gate electrode in said shielded trenched gates connected to a gate metal formed over said insulation layer and said shielded electrode in said shielded trenched gates connected to a source metal formed over said insulation layer;
each said shielded trenched gate in said active area further comprises a first type gate oxide along sidewalls of said gate electrode and a second type gate oxide surrounding bottom and sidewalls of said shielded electrode;
multiple said trenched floating gates having floating voltage in parallel formed in termination area around outside of said active area and surrounded by said second type body regions and extending into said epitaxial layer, said trenched floating gates having trench depth equal to or deeper than body junction of said second type body regions;
each said second type body region between two adjacent of said trenched floating gates in said termination area having floating voltage;
a drain metal on rear side of said substrate.

2. The trench MOSFET of claim 1, wherein each said trenched floating gates in said termination area comprises a single shielded electrode having same conductive material as said shielded electrode in said trenched shielded gates in said active area, padded by said second type gate oxide layer.

3. The trench MOSFET of claim 1, wherein each said trenched floating gates in said termination area has same gate electrode and shielded electrode structures, and conductive materials as said shielded trenched gates in said active area.

4. The trench MOSFET of claim 1, wherein said trenched floating gates in said termination area have same trench width and depth as said shielded trenched gates in said active area.

5. The trench MOSFET of claim 1, wherein said trenched floating gates in said termination area have greater trench width and depth than said shielded trenched gates in said active area.

6. The trench MOSFET of claim 1, wherein the width of said trenched floating gates in said termination area increases toward the edge of said termination area.

7. The trench MOSFET of claim 1, wherein the width of said trenched floating gates in said termination area decreases toward the edge of said termination area.

8. The trench MOSFET of claim 1, wherein trench space between every two adjacent of said trenched floating gates in said termination area is equal.

9. The trench MOSFET of claim 1, wherein trench space between every two adjacent of said trenched floating gates in said termination area is increased toward the edge of said termination area.

10. The trench MOSFET of claim 1, wherein said shielded trenched gates in said active area are deeper than said first type body region.

11. The trench MOSFET of claim 1, wherein said second type gate oxide has oxide thickness greater than said first type gate oxide.

12. The trench MOSFET of claim 1, wherein said shielded trenched gates in said active area further extend to at least a wider shielded trenched gate for connection of said gate electrode to gate metal, wherein said wider shielded trenched gate has the same shielded gate structure as said shielded trenched gates in said active area while has greater trench width than said shielded trenched gates in said active area.

13. The trench MOSFET of claim 1 further comprises at least one wider trench filled with said shielded electrode only padded by said second type gate oxide, extended from said shield trenched gates for shielded electrode contact to source metal.

14. The trench MOSFET of claim 1 further comprises a plurality of trenched source-body contacts with each filled with a metal plug, penetrating through said insulation layer, said source regions and extending into said first type body regions, wherein said metal plug is padded by a barrier layer and contacting with said source metal.

15. The trench MOSFET of claim 12 further comprises at least a trenched gate electrode contact with each filled with a metal plug, penetrating through said insulation layer and extending into said gate electrode in said wider shielded trenched gate for gate electrode connection, wherein said metal plug is padded by a barrier layer and contacting with said gate metal.

16. The trench MOSFET of claim 13 further comprises at least a trenched shielded electrode contact with each filled with a metal plug, penetrating through said insulation layer and extending into said shielded electrode in said wider trench for shielded electrode contact, wherein said metal plug is padded by a barrier layer and contacting with said source metal.

17. The trench MOSFET of claim 14 further comprising a body contact region of said second conductivity type with said first type body region and underneath each of said trenched source-body contacts, said body contact region having a higher doping concentration than said first type body region.

18. The trench MOSFET of claim 1, wherein said plurality of transistor cells are closed cells.

19. The trench MOSFET of claim 1, wherein said plurality of transistor cells are stripe cells.

20. The trench MOSFET of claim 1, wherein each said source region in said active area has uniform doping concentration and junction depth along the top surface of said epitaxial layer.

21. The trench MOSFET of claim 14, wherein each said source regions in said active area has doping concentration of Gaussian-distribution from edge of each said trenched source-body contacts to adjacent channel region near the shielded trenched gate, and has junction depth near edge of said trenched source-body contacts greater than near said adjacent channel region.

22. The trench MOSFET of claim 1, wherein said first type body regions and said second type body region are formed at same time and have same junction depth in said epitaxial layer.

* * * * *